US006576933B2

United States Patent
Sugawara et al.

(10) Patent No.: US 6,576,933 B2
(45) Date of Patent: Jun. 10, 2003

(54) SEMICONDUCTOR LIGHT EMITTING DEVICE AND METHOD FOR MANUFACTURING SAME

(75) Inventors: Hideto Sugawara, Kawasaki (JP); Koichi Nitta, Yokohama (JP); Hirohisa Abe, Yokohama (JP); Kuniaki Konno, Yokohama (JP); Yasuo Idei, Tama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/803,457

(22) Filed: Mar. 9, 2001

(65) Prior Publication Data

US 2002/0030197 A1 Mar. 14, 2002

(30) Foreign Application Priority Data

Mar. 10, 2000 (JP) .......................................... 2000-066736
Dec. 27, 2000 (JP) .......................................... 2000-396957

(51) Int. Cl.[7] .............................................. H01L 29/78
(52) U.S. Cl. .......................................... 257/103; 257/96
(58) Field of Search ............................. 257/103, 96, 80

(56) References Cited

U.S. PATENT DOCUMENTS 5,955,749 A * 9/1999 Joannopoulos et al.

FOREIGN PATENT DOCUMENTS

| EP | 0-486052 | 5/1992 |
| EP | 772248 | * 7/1997 |
| JP | 08-288549 | 3/1997 |
| JP | 10-261818 | 9/1998 |
| JP | 11-126925 | 8/1999 |
| JP | 11-274558 | 10/1999 |
| JP | 11-284282 | 10/1999 |
| JP | 09-71421 | 1/2000 |
| JP | 00-44053 | 7/2000 |
| JP | 00-76005 | 12/2000 |

OTHER PUBLICATIONS

Xiaoyun Guo, et al., "Photon Recycling Semiconductor Light Emitting Diode", Electron Devices Meeting, 1999, IEDM Technical Digest. International Washington, D.C., USA Dec. 5–8, 1999, Piscataway, NJ USA, IEEE.

X. Guo, J.W. Graff, and E. F. Schubert "Photon–Recycling for High Brightness LEDs", Boston University, Forum—LEDs pp. 68–73, Compound Semiconductor 6(4) May/Jun. 2000.

"Substrate availability for 150 mm GaAs Developments in nitride electronics", III–Vs Review—vol. 13, No. 4, Jul./Aug. 2000.

* cited by examiner

Primary Examiner—Stephen D. Meier
(74) Attorney, Agent, or Firm—Hogan & Hartson, LLP

(57) ABSTRACT

There are provided a semiconductor light emitting device wherein the variation in tone in each device is small and the variation in tone due to deterioration with age is also small, and a method for manufacturing the same. The semiconductor light emitting device includes an active layer for emitting primary light having a first wavelength by current injection, and a light emitting layer excited by the primary light for emitting secondary light having a second wavelength different from said first wavelength, wherein the primary light and the secondary light are mixed to be outputted.

24 Claims, 13 Drawing Sheets

SEMICONDUCTOR LIGHT EMITTING DEVICE AND METHOD FOR MANUFACTURING SAME

CROSS REFERENCE TO RELATED APPLICATIONS

This application claims benefit of priority under 35USC §119 to Japanese Patent Applications No. 2000-066736, filed on Mar. 10, 2000 and No. 2000-396957, filed on Dec. 27, 2000, the entire contents of which are incorporated by reference herein.

BACKGROUND OF THE INVENTION

1. Field of The Invention

The present invention relates generally to a semiconductor light emitting device and a method for manufacturing the same.

2. Related Background Art

In recent years, semiconductor white light emitting devices are widely noticed as successors to incandescent lamps and fluorescent lamps. Such a semiconductor white light emitting device is characterized by a simple driving circuit and small electric power consumption.

As the semiconductor white light emitting devices, there are proposed devices using GaN compound semiconductor light emitting elements (GaN compound semiconductor white light emitting devices) and devices using ZnSe compound semiconductor light emitting elements (ZnSe compound semiconductor light emitting devices).

The GaN compound semiconductor white light emitting devices are described in, e.g., Japanese Patent Laid-Open Nos. 10-242513, 10-12916 and 11-121806.

The GaN compound semiconductor white light emitting device disclosed in Japanese Patent Laid-Open No. 10-242513 comprises a GaN compound semiconductor light emitting element for emitting blue light, and a YAG:Ce fluorescent material for absorbing the emitted blue light to emit yellow light, to achieve white light by mixing the blue light emission and the yellow light emission. The YAG:Ce fluorescent material is mixed in a resin to be applied to a portion surrounding the semiconductor light emitting element.

The GaN compound semiconductor white light emitting device disclosed in Japanese Patent Laid-Open No. 10-12916 comprises a GaN compound semiconductor light emitting element for emitting ultraviolet light, and three kinds of fluorescent materials for absorbing the emitted ultraviolet light to emit red light, the green light and the blue light, to achieve white light by mixing red light emission, green light emission and blue light emission. The fluorescent materials are mixed in a resin to be applied to a portion surrounding the semiconductor light emitting element.

The GaN compound semiconductor white light emitting device disclosed in Japanese Patent Laid-Open No. 11-121806 comprises three kinds of active layers including an active layer for emitting red light, an active layer for emitting green light and an active layer for emitting blue light, to achieve white light by mixing the red light emission, the green light emission and the blue light emission. The three kinds of active layers are separately provided, and a current is injected into each of the active layers.

A ZnSe compound semiconductor light emitting device comprises a ZnSe compound semiconductor light emitting element for emitting blue light, and an emission center, formed on the substrate, for emitting yellow light, to achieve white light by mixing the blue light emission and the yellow light emission.

However, as a result of the inventors' experimental manufacture and evaluation, it was found that, in the conventional semiconductor white light emitting devices, there are problems in that the tone of white light varies for each device and that the tone deteriorates with age, as follows.

First, when a fluorescent material is mixed in a resin to be applied to a portion surrounding a semiconductor element as in the semiconductor white light emitting device disclosed in Japanese Patent Laid-Open No. 10-242513, it is difficult to maintain the quantity of the fluorescent material for each element at a constant level, so that the quantity of the fluorescent material varies for each device. For example, when the quantity of the fluorescent material is large, the intensity of emitted yellow light is high, so that the tone of white light is close to yellow. On the other hand, when the quantity of the fluorescent material is small, the intensity of emitted yellow light is low, so that the tone of white light is close to blue. For that reason, the tone of white light varies for each device. In addition, since the fluorescent material is deteriorates more easily than the semiconductor light emitting element, the tone greatly deteriorates with age. For example, when the fluorescent material deteriorates to and the yellow light emission weakens the tone is close to blue.

In addition, when three kinds of fluorescent materials are used as in the semiconductor white light emitting device disclosed in Japanese Patent Laid-Open No. 10-12916, it is difficult to carry out a proper mixing of the fluorescent materials, so that the compounding ratio of the fluorescent materials varies for each device. For example, when the quantity of the blue light emitting fluorescent material is large, the tone is close to blue. For that reason, the tone of white light varies every device. Also, as in the case of the above described devices, the variation in tone due to the variation in quantity of the fluorescent materials, and the variation in tone due to the deterioration of the fluorescent materials are easily caused.

In addition, in the structure wherein three kinds of active layers for red light emission, green light emission and blue light emission are used as in the semiconductor white light emitting device disclosed in Japanese Patent Laid-Open No. 11-121806, the light emission of each layer varies in accordance with the injected current, so that it is difficult to adjust the balance of light emissions of three colors. For example, when the current injected into the blue light emitting active layer is too large, the tone of white light is close to blue. For that reason, the tone of white light varies.

Moreover, in the structure wherein an emission center is formed on the substrate as in the ZnSe compound semiconductor light emitting device, it is difficult to maintain the quantity of the emission center at a constant level for each wafer, so that the quantity of the emission center varies for each wafer. For example, when the quantity of the emission center is large, the quantity of emitted yellow light is large, so that the tone of white light is close to yellow. On the other hand, when the quantity of the emission center is small, the quantity of emitted yellow light is small, so that the tone is close to blue. For that reason, the tone of white light varies.

Thus, it was found that, in the conventional semiconductor white light emitting devices, there are problems in that the tone of white light varies for each device and that the tone deteriorates with age.

SUMMARY OF THE INVENTION

It is therefore an object of the present invention to eliminate the aforementioned problems and to provide a semiconductor light emitting device wherein the variation in tone is small and the deterioration of tone is slow.

In order to accomplish the aforementioned and other objects, according to one aspect of the present invention, there is provided a semiconductor light emitting device comprising: a semiconductor light emitting element which has an active layer for emitting primary light having a first wavelength by current injection; and at least one semiconductor laminate which is bonded to said semiconductor light emitting element and which has a light emitting layer, excited by said primary light, for emitting secondary light having a second wavelength different from said first wavelength, wherein said primary light and said secondary light are mixed to be outputted.

The active layer may be a $In_pGa_qAl_{1-p-q}N$ ($0 \leq p \leq 1$, $0 \leq q \leq 1$, $0 \leq p+q \leq 1$) active layer. And the $In_pGa_qAl_{1-p-q}N$ active layer includes, for example, an active layer having a multi-quantum well structure of InGaN and GaN. The light emitting layer may be an $In_bGa_cAl_{1-b-c}P$ ($0 \leq b \leq 1$, $0 \leq c \leq 1$, $0 \leq b+c \leq 1$) light emitting layer.

According to another aspect of the present invention, there is provided a semiconductor light emitting device comprising: A semiconductor light emitting device comprises: a GaAs substrate; an $In_bGa_cAl_{1-b-c}P$ ($0 \leq b \leq 1$, $0 \leq c \leq 1$, $0 \leq b+c \leq 1$) light emitting layer which is formed on said GaAs substrate and which is excited by primary light having a first wavelength for emitting secondary light having a second wavelength; a buffer layer formed on said $In_bGa_cAl_{1-b-c}P$ light emitting layer; and a $Zn_jCd_{i-j}Se$ ($0 \leq j \leq 1$) active layer which is formed on said buffer layer and which emits said primary light having the first wavelength by current injection; wherein said primary light and said secondary light are mixed to be outputted.

The $Zn_j Cd_{i-j}$ Se active layer includes, for example, an active layer having a multi-quantum well structure of ZnCdSe and ZnSe.

According to another aspect of the present invention, there is provided a method for manufacturing a semiconductor light emitting device, the method comprising: a semiconductor light emitting element forming step including a step of forming on a first substrate a semiconductor layers, which has an active layer for emitting primary light having a first wavelength by current injection; a semiconductor laminate forming step including a step of forming on a second substrate a semiconductor layers, which includes a light emitting layer excited by said primary light for emitting secondary light having a second wavelength different from said first wavelength; and a bonding step including a step of integrally bonding said semiconductor light emitting element to said semiconductor laminate.

According to another aspect of the present invention, there is provided a method for manufacturing a semiconductor light emitting device, the method comprising the steps of: forming on a GaAs substrate an $In_b Ga_cAl_{1-b-c}P$ ($0 \leq b \leq 1$, $0 \leq c \leq 1$, $0 \leq b+c \leq 1$) light emitting layer, which is excited by blue light for emitting yellow light; forming a buffer layer on said $In_bGa_cAl_{1-b-c}P$ light emitting layer; and forming on said buffer layer a ZnCe compound active layer, which emits said blue light by current injection.

According to a further aspect of the present invention, there is provided a semiconductor light emitting device comprising: a substrate; a buffer layer formed on said substrate; a first conductive type $In_rGa_sAl_{1-r-s}N$ ($0 \leq r \leq 1$, $0 \leq s \leq 1$, $0 \leq r+s \leq 1$) cladding layer formed on said buffer layer, an $In_pGa_q Al_{1-p-q}N$ ($0 \leq p \leq 1$, $0 \leq q \leq 1$, $0 \leq p+q \leq 1$) active layer formed on said first conductive type $In_rGa_sAl_{1-r-s}N$ cladding layer and provided with an ion implantation region into which ions selected from the group consisting of fluorine, oxygen, nitrogen, carbon and sulfur have been injected, regions other than said ion implantation region emitting primary light having a first wavelength, and said ion implantation region emitting secondary light having a second wavelength different from said first wavelength; and a second conductive type $In_tGa_sAl_{1-t-u}N$ ($0 \leq t \leq 1$, $0 \leq u \leq 1$, $0 \leq t+u \leq 1$) cladding layer formed on said active layer.

According to a still further aspect of the present invention, there is provided a semiconductor light emitting device comprising: a semiconductor light emitting element which has an active layer for emitting primary light having a first wavelength by current injection; reflector for reflecting said primary light emitted from said semiconductor light emitting element; and fluorescent material which is applied on part of said reflector and which is excited by said primary light for emitting secondary light having a second wavelength different form said first wavelength.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to specific embodiments, but are for the purpose of explanation and understanding only.

In the drawings.

DESCRIPTION OF THE PREFERRED EMBODIMENTS

Thirteenth kinds of preferred embodiments of the present invention will be described below.

First, in each of the first through seventh preferred embodiments, there will be described a semiconductor white light emitting device which comprises a semiconductor light emitting element for emitting blue light by current injection, and a semiconductor laminate for transforming the blue light to emit light of another color, the semiconductor laminate being bonded substantially to the entire light emitting surface of the semiconductor light emitting element or the entire opposite surface to the light emitting surface. Among these embodiments, in each of the first through fifth preferred embodiments, a GaN compound semiconductor light emitting element is used as the semiconductor light emitting element, and in the each of sixth and seventh preferred embodiments, a ZnSe compound semiconductor light emitting element is used as the semiconductor light emitting element.

Then, in each of the eighth through eleventh preferred embodiments, there will be described a semiconductor white light emitting device which comprises a GaN compound semiconductor light emitting element for emitting blue light, and a semiconductor laminate having a double-hetero structure for transforming the blue light to emit yellow light, the semiconductor laminate being bonded to a part of the light emitting surface of the GaN compound semiconductor light emitting element or a part of the opposite surface to the light emitting surface.

Moreover, in each of the twelfth and thirteenth preferred embodiments, there will be described another semiconductor white light emitting device relevant to the present invention.

Referring now to the accompanying drawings, the preferred embodiments of a semiconductor light emitting device according to the present invention will be described below.

First Preferred Embodiment

Figure 1:
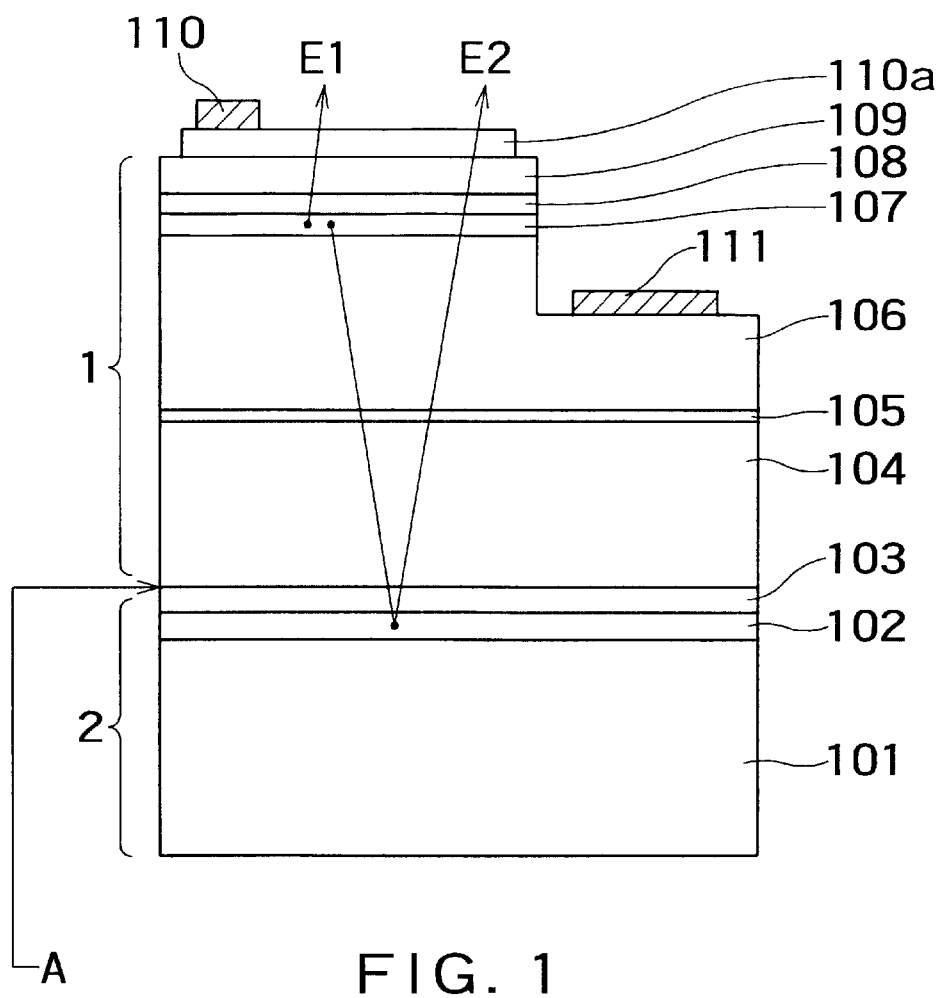
FIG. 1 is a schematic sectional view of the first preferred embodiment of a semiconductor light emitting device according to the present invention.

FIG. 1 is a schematic sectional view showing the first preferred embodiment of a semiconductor white light emitting device according to the present invention. A semiconductor light emitting element 1 for emitting blue light E1 by current injection and a semiconductor laminate 2 excited by the blue light E1 for emitting yellow light E2 are bonded to each other at a bonding surface A to constitute a semiconductor white light emitting device. As can be seen from FIG. 1, these light beams are emitted from the top side in the figure.

First, the semiconductor light emitting element 1 will be described. On the top face of a sapphire substrate 104 in the figure, there are sequentially formed a buffer layer 105, an n-type GaN cladding layer (n-type contact layer) 106, an active layer 107 having a GaN/InGaN multi-quantum well structure (MQW structure), a p-type AlGaN cladding layer 108 and a p-type GaN contact layer 109. Furthermore, the "n-type GaN cladding layer 106" will sometimes be referred to as the "n-type cladding layer 106" herein. The same applies to the other layers.

A part of the semiconductor light emitting element 1 is etched to expose the n-type cladding layer 106 to form an n-side electrode 111 contacting the n-type cladding layer 106. On the top of the p-type contact layer 109, a p-side transparent electrode 110a is formed. The p-side transparent electrode 110a is made of a metal thin film or a conductive oxide film, and is capable of transmitting blue light E1 emitted from the active layer 107 and yellow light E2 emitted from a light emitting layer 102. Thus the transparent electrode is used, the emission luminance of the device of FIG. 1 increases since the light emitting surface is arranged on the p-type contact layer 109. On the top of the p-side transparent electrode 110a, a p-side electrode 110 is formed. A current is injected from the p-side electrode 110 and the n-side electrode 111 to emit blue light E1 from the active layer 107.

The semiconductor laminate 2 will be described below. The semiconductor laminate 2 has a structure wherein the light emitting layer 102 of an InAlP/InGaAlP multilayer film is located between a GaAs substrate 101 and an InAlP cladding layer (contact layer) 103. The GaAs substrate 101 has a lattice constant close to that of the light emitting layer 102 of an InAlP/InGaAlP multilayer film. Therefore, the GaAs substrate is used for carrying out the crystal growth, the crystalline characteristic of the light emitting layer 102 is improved to enhance the luminous efficiency. The GaAs substrate 101 is non-transparent with respect to yellow light E2 emitted from the light emitting layer 102 and blue light E1 emitted from the active layer 107. However, since the GaAs substrate 101 is arranged on the opposite side to the light emitting surface in the device of FIG. 1, the emission luminance is high even if the GaAs substrate 101 exists. For that reason, in the device of FIG. 1, the GaAs substrate is not removed, so that the manufacturing process is simplified. Since the GaAs substrate 101 also has a smaller band gap than the light emitting layer 102, the GaAs substrate 102 does not serve as the cladding layer of the light emitting layer 102. Therefore, in the semiconductor laminate 2 of FIG. 1, the light emitting layer 102 is made of the InAlP/InGaAlP multilayer film, so that electrons and holes generated by blue light E1 emitted from the semiconductor light emitting element 1 can be confined in the light emitting layer 102. Thus the light emitting layer 102 has the multilayer structure, the luminous efficiency of the emitted yellow light E2 is enhanced, so that the emission luminance of the emitted yellow light E2 increases. In FIG. 1 the top face of the InAlP cladding layer 103 of the semiconductor laminate 2 thus constructed is bonded to the bottom face of the sapphire substrate 104 of the semiconductor light emitting element 1.

In the semiconductor light emitting element 1 and semiconductor laminate 2 described above, blue light E1 having a wavelength of 485 nm is emitted from the active layer 107 of the semiconductor light emitting element 1 by current injection, a part of the blue light E1 emitted downward in the figure is incident on the semiconductor laminate 2, and the incident blue light E1 excites the light emitting layer 102 of the semiconductor laminate 2 to cause it to emit yellow light E2 having a wavelength of 590 nm. Thus, the blue light E1 emitted from the active layer 107 and the yellow light E2 emitted from the light emitting layer 102 can realize white light emission.

In the semiconductor white light emitting device of FIG. 1, the color temperature of white light was about 8000 K, and the luminous intensity during the injection of a current of 20 mA is 2 cd in a package having a radiation angle of 10 degrees. The color temperature of white light can be controlled by adjusting the emission wavelengths and emission intensities of the semiconductor light emitting element 1 and semiconductor laminate 2. In the element structure of FIG. 1, the transparent characteristic of the p-side transparent electrode 110a also has an influence on the color temperature and the luminous intensity. That is, since the p-side transparent electrode 110a transmits light E1 and light E2 having different wavelengths, a required color temperature can be obtained by adjusting the transmittance for each light.

In the semiconductor white light emitting device of FIG. 1 described above, it is possible to decrease the variation in tone for each element. Because the thickness and composition of the semiconductor laminate 2 hardly vary for each element. That is, by using a standardized mass production process generally used for the manufacturing of semiconductor elements, the semiconductor laminate 2 can be manufactured with high repeatability so that the thickness and composition hardly vary. Thus the thickness and composition of the semiconductor laminate 2 are uniform for each element, the ratio of the quantity of the blue light E1 emitted from the semiconductor light emitting element 1 to that of the yellow light E2 emitted from the semiconductor laminate 2 does not vary for each device, so that the tone does not vary for each device.

In the semiconductor white light emitting device of FIG. 1, the tone hardly deteriorates with age, because the deterioration with age of the yellow light emitting semiconductor laminate 2 is smaller than that of fluorescent lamps. Since the deterioration with age of the semiconductor laminate 2 is small, the ratio of the quantity of the blue light E1 emitted from the semiconductor light emitting element 1 to that of the yellow light E2 emitted from the semiconductor laminate 2 does not vary, so that the tone hardly vary.

Figure 2:
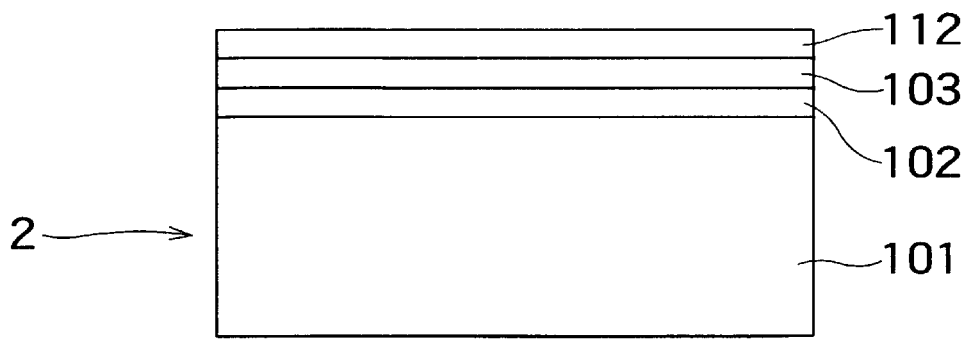
FIG. 2 is a schematic sectional view showing a method for manufacturing the first preferred embodiment of a semiconductor light emitting device according to the present invention.
Figure 3:
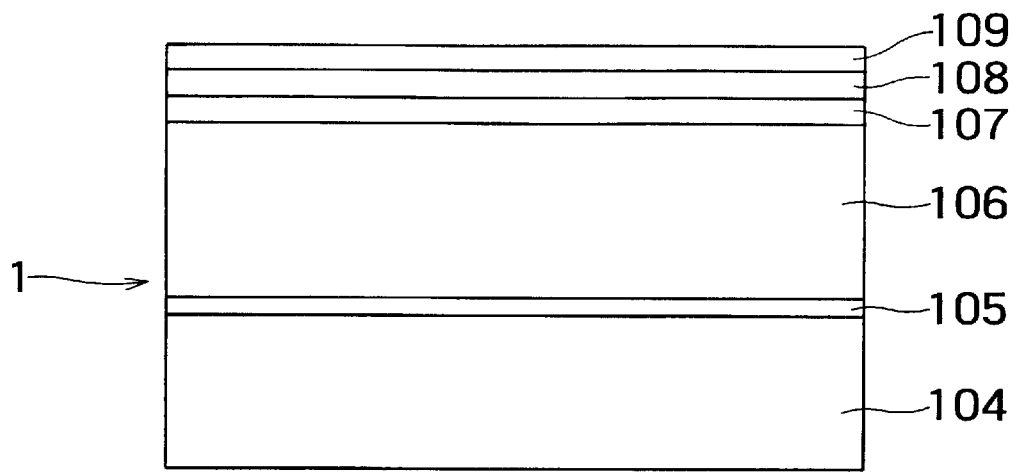
FIG. 3 is a schematic sectional view showing a method for manufacturing the first preferred embodiment of a semiconductor light emitting device according to the present invention.

Referring to FIGS. 2 and 3, a method for manufacturing the semiconductor white light emitting device of FIG. 1 will be described below. As shown in FIG. 2, one of the features of this manufacturing method is that a light emitting layer 103 is formed on a GaAs substrate 101 suitable for the formation of the light emitting layer 103, and thereafter, this is bonded to a semiconductor blue light emitting device 1.

First, in the manufacturing of the semiconductor laminate 2, a GaAs substrate (a second substrate) 101 is cleaned with an organic solvent and/or a sulfuric acid containing etchant, and then, the GaAs substrate 101 is introduced into an MOCVD system. Then, the GaAs substrate 101 is heated to 730° C., and an appropriate 5-Group material serving as a P material is supplied to sequentially grow a light emitting layer 102 of an InAlP/InGaAlP multilayer film and an InAlP cladding layer 103. Further a GaAs cap layer 112 is grown on the surface thereof. The GaAs cap layer 112 is a protection layer which is finally removed. The thickness of these layers are shown in the following table 1.

TABLE 1

| InAlP/InGaAlP Light Emitting Layer 102 | 30 nm/50 nm |
| InAlP Cladding Layer 103 | 300 nm or less |
| GaAs Cap Layer 113 | 100 nm |

Specifically, the light emitting layer 102 has a structure wherein 20 InAlP layers having a thickness of 30 nm and 20 $In_{0.5}(Ga_{0.7}Al_{0.3})_{0.5}P$ layers having a thickness of 50 nm are alternately stacked. The InAlP cladding layer 103 serves as an adhesive layer for bonding the semiconductor laminate 2 to the semiconductor light emitting element 1, also serves and as a protection layer for protecting the light emitting layer 102. At the same time it has the function of confining excitation carriers therein. Since the InGaAlP contact layer absorbs emitted blue light E1, it preferably has a thickness of 100 nm or less to reduce light loss due to the absorption of blue light E1.

Then, in the manufacturing of the semiconductor light emitting element 1, as can be seen from FIG. 3, a sapphire substrate (a first substrate) 104 is cleaned with an organic solvent and/or a sulfuric acid containing etchant, and then, is introduced into the MOCVD system. Then, after the sapphire substrate 104 is thermally cleaned at 1100° C., a buffer layer 105, an n-type GaN cladding layer 106, a GaN/InGaN active layer 107 of the MQW structure, a p-type AlGaN cladding layer 108 and a p-type GaN cladding layer 109 are sequentially formed. The growth temperature and thickness of these layers are shown in Table 2.

TABLE 2

| Buffer Layer 105 | 500° C. | 30 nm |
| n-type GaN Cladding Layer 106 | 1050° C. | 4 μm |
| GaN/InGaN Active Layer 107 | 750° C. | 7 nm/3 nm |
| p-type AlGaN Cladding Layer 108 | 1050° C. | 50 nm |
| p-type GaN Contact Layer 109 | 1050° C. | 150 nm |

Specifically, the active layer 107 has a 5QW structure of an $In_{0.35}Ga_{0.65}N$ layer having a thickness of 3 nm and a GaN layer having a thickness of 7 nm.

Then, the semiconductor light emitting element 1 and the semiconductor laminate 2 thus manufactured are bonded to each other. Before bonding, the GaAs cap layer 112 formed on the semiconductor laminate 2 as the protection layer is etched to be removed with a sulfuric acid containing etchant. After the GaAs cap layer 112 is removed, the surface of the InAlP cladding layer 103 is subsequently cleaned. With respect to the semiconductor light emitting element 1, the bottom side of the sapphire substrate 104 in FIG. 3 is mirror-polished and simultaneously trimmed to form a flat surface. In order to facilitate the element isolation which will be carried out later, the trimming was carried out so that the whole thickness of the semiconductor light emitting element 1 is about 100 μm.

Then, the bottom side of the sapphire substrate 104 of the semiconductor light emitting element 1 in FIG. 3 is aligned with the top side of the InAlP cladding layer 103 of the semiconductor laminate 2 in FIG. 2. Specifically, after the semiconductor light emitting element 1 is aligned with the semiconductor laminate 2, they are annealed at 500° C. in an atmosphere of nitrogen for 30 minutes to be bonded to each other by a dehydrating condensation reaction. In order to improve adhesion, the surfaces to be bonded are preferably as flat as possible. In the planarization of the InAlP cladding layer 103 of the semiconductor laminate 2, the GaAs substrate 101 inclined in a direction of [011] from the plane (100) is effectively used. In FIG. 2, the GaAs substrate 101 inclined at 15° is used so that the surface roughness of the top side of the InAlP cladding layer 103 in the figure is about 2 nm. The surface roughness of the bottom side of the sapphire substrate 104 in FIG. 3 is made 20 nm or less by the mirror polishing.

Then, as can be seen from FIG. 1, a part of the semiconductor light emitting element 1 is etched from the p-type contact layer 109 to the n-type cladding layer 106, and then, n-side electrode 111, a p-side transparent electrode 110*a* and a p-side electrode 110 are formed on the exposed n-type cladding layer 106 and p-type contact layer 109. Moreover, the bottom side of the GaAs substrate 101 is polished if necessary.

The semiconductor white light emitting device of FIG. 1 is thus obtained.

In the above described method for manufacturing the semiconductor light emitting device in this preferred embodiment, the light emitting layer 102 is formed on the top of the GaAs substrate 101 suitable for the formation of the light emitting layer 102, and, this is bonded to the semiconductor blue light emitting element 1. Therefore it is possible to provide a semiconductor white light emitting device which has a small number of crystal defects in the light emitting layer 102 and which has high reliability.

In the method for manufacturing the semiconductor light emitting element in this preferred embodiment, the blue light emitting semiconductor light emitting element 1 and the yellow light emitting semiconductor laminate 2 are integrated with each other by bonding to fabricate a single device. Therefore, the device can be used in a space smaller than it is used to be in a case where two devices are used, and the number of electrodes can be reduced. In addition, since the device can be regard as a point light source by the integration, it is possible to provide an element showing a small variation in emitting lights.

Second Preferred Embodiment

Figure 4:
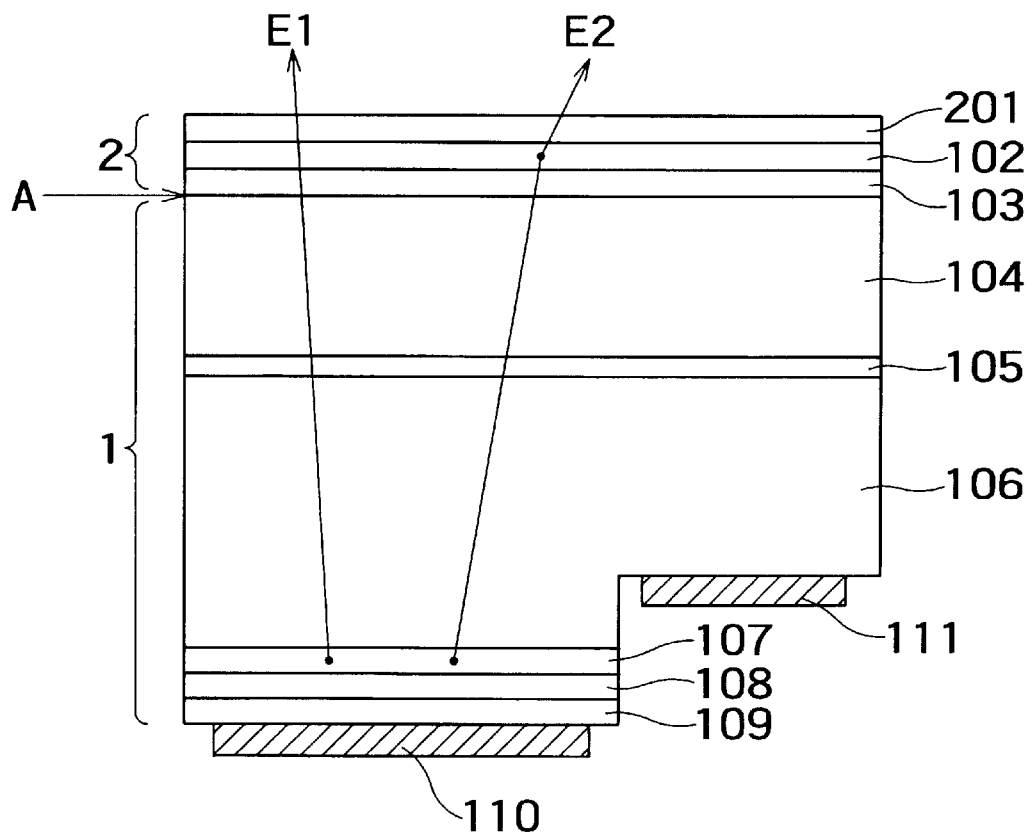
FIG. 4 is a schematic sectional view of the second preferred embodiment of a semiconductor light emitting device according to the present invention.

As can be seen from FIG. 4, one of different points of a semiconductor white light emitting device in the second preferred embodiment from the device in the first preferred embodiment (FIG. 1) is that the substrate 104 side of a semiconductor light emitting element 1 serves as a light emitting surface and that a semiconductor laminate 2 is bonded to the side of the light emitting surface.

FIG. 4 is a schematic sectional view showing the second preferred embodiment of a semiconductor white light emitting device according to the present invention. The same reference numbers are given to elements corresponding to those in the first preferred embodiment (FIG. 1). As in the case with the first preferred embodiment (FIG. 1), a semiconductor light emitting element 1 for emitting blue light E1 from an active layer 107 by current injection and a semiconductor laminate 2 excited by the blue light E1 for emitting yellow light E2 from a light emitting layer 102 are bonded to each other at a bonding surface A to constitute a semiconductor white light emitting device. As can be seen from FIG. 4, these light beams are emitted from the top side in the figure.

First, the semiconductor light emitting element 1 will be described. One of different points of the semiconductor light emitting element 1 from that in the first preferred embodiment (FIG. 1) is that the transparent electrode 110*a* is not used as a p-side electrode. In the semiconductor light emitting element 1 of FIG. 4, a p-side electrode 110 of Ni/Au or the like having a high reflectance is formed substantially on the entire surface of a p-type contact layer 109. Thus, the blue light E1 emitted downward from the active layer 107 in the figure can be reflected on the p-side electrode 110 to be effectively emitted from the light emitting surface on the top side in the figure. Other principal features are the same as those in the first preferred embodiment.

The semiconductor laminate 2 will be described below. One of different points of the semiconductor laminate 2 from that in the first preferred embodiment (FIG. 1) is that the GaAs substrate 101 is removed and an $SiO_2$ protection layer 201 is formed on that surface. This is for preventing light from being absorbed into the GaAs substrate 101. That is, in the device of FIG. 4, the semiconductor laminate 2 is bonded to the light emitting surface. Accordingly if the GaAs substrate exists, the emitted blue light E1 and yellow light E2 are absorbed into the GaAs substrate if the GaAs substrate exists. Therefore, the GaAs substrate is removed to enhance the emission luminance.

A process for manufacturing the semiconductor light emitting element 1 and the semiconductor laminate 2 is basically the same as that in the first preferred embodiment. Specifically, the InAlP/InGaAlP multilayer film 102 is formed so as to have a structure that 10 InAlP layers and 10 $In_{0.5}(Ga_{0.7}Al_{0.3})_{0.5}P$ layers are alternately stacked. The GaAs substrate is removed with a hydrofluoric acid containing etchant.

The semiconductor white light emitting device of FIG. 4 thus obtained was mounted on a package so that the electrodes 110 and 111 faced downward, and a current was injected. As a result, the blue light E1 having a wavelength of 485 nm was emitted from the active layer 107, and the yellow light E2 having a wavelength of 590 nm was emitted from the light emitting layer 102 by exciting the blue light E1. These light beams passed through the oxide film 201 to be observed as white light. The color temperature of white light was about 8000 K, and the luminous intensity during the injection of a current of 20 mA was 3 cd in a package having a radiation angle of 10 degrees.

Even if the light emitting surface is arranged on the side of the substrate 104 as in this preferred embodiment, it is possible to decrease the variation in tone in each device and the variation in tone due to deterioration with age, as in the case with the first preferred embodiment.

Third Preferred Embodiment

Figure 5:
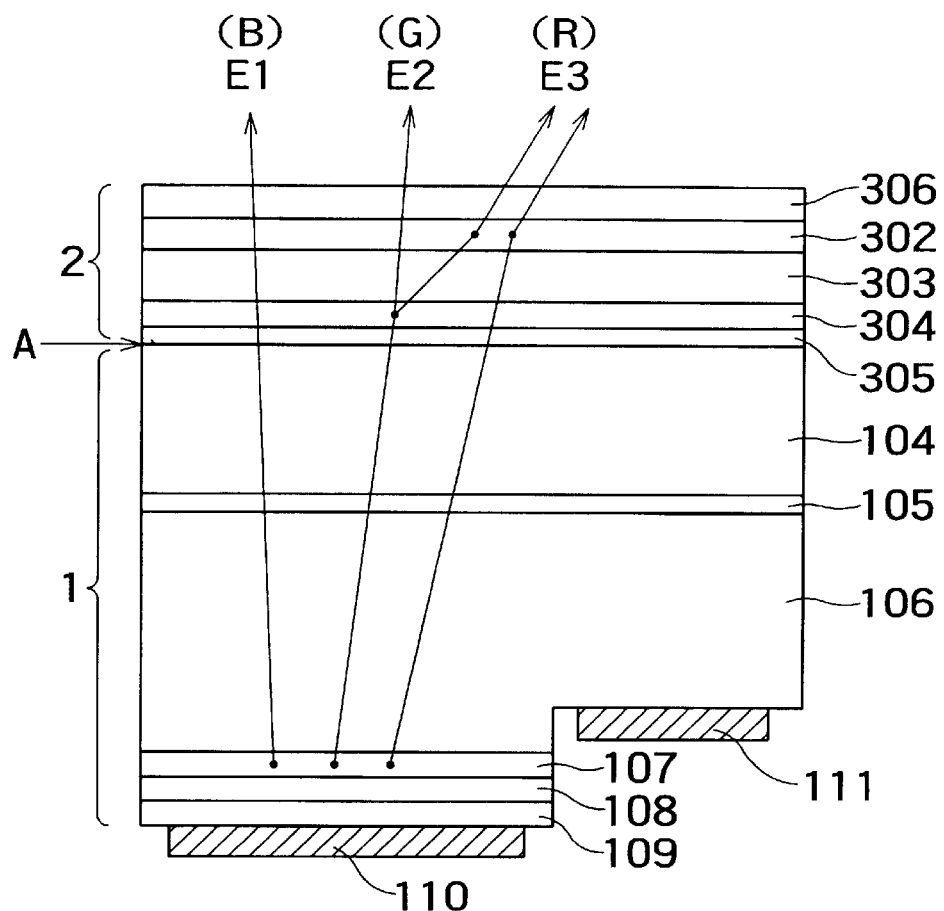
FIG. 5 is a schematic sectional view of the third preferred embodiment of a semiconductor light emitting device according to the present invention.

As can be seen from FIG. 5, one of different points of a semiconductor white light emitting device in the third preferred embodiment from the device in the second preferred embodiment (FIG. 4) is that two light emitting layers 302 and 304 are formed in a semiconductor laminate 2.

FIG. 5 is a schematic sectional view showing the third preferred embodiment of a semiconductor white light emitting device according to the present invention. The same reference numbers are given to elements corresponding to those in the second preferred embodiment (FIG. 4). A semiconductor light emitting element 1 for emitting blue light E1 from an active layer 107 by current injection and a semiconductor laminate 2, which is excited by the blue light E1 for emitting green light E2 from a first light emitting layer 304 and which is excited by the green light E2 and the blue light E1 for emitting red light E3 from a second light emitting layer 302, constitute a semiconductor white light emitting device. As can be seen from FIG. 5, these light beams are emitted from the top side in the figure.

First, the structure of the semiconductor light emitting element 1 is basically the same as that in the second preferred embodiment (FIG. 4), so that the detailed description thereof is omitted.

The semiconductor laminate 2 will be described below. Between the first light emitting layer 304 and the second light emitting layer 302, a first InAlP cladding layer 303 is provided. On the bottom face of the first light emitting layer 304 in the figure, a second InAlP cladding layer 305 for bonding the semiconductor laminate 2 to the semiconductor light emitting element 1 is formed. The top face of the second light emitting layer 302 in the figure is covered with an oxide film 306 which is a protection layer.

When a third InAlP cladding layer (not shown) is provided between the oxide film 306 and the second light emitting layer 302, it is possible to adjust tone. That is, when the third InAlP cladding layer is provided, carriers are effectively confined in the second light emitting layer 302, so that the quantity of red light E3 increases, and the blue light E1 is absorbed into the third InAlP cladding layer, so that the quantity of blue light E1 decreases.

As shown in FIG. 5, in the above described semiconductor light emitting element 1 and semiconductor laminate 2, the side of the protection layer 306 of the semiconductor laminate 2 serves as a light emitting surface to obtain white color due to the color mixture of three emissions E1, E2 and E3. That is, the current is injected into the semiconductor light emitting element 1 to obtain the blue light E1 emitted from the active layer 107 having the MQW structure, and the first light emitting layer 304 of the semiconductor laminate 2 is excited to obtain the green light 2. Moreover, the second light emitting layer 302 is excited with the emitted blue light E1 and green light E2 to obtain the red light E3. By the hybridization of these light beams, white light is obtained.

Specifically, blue light E1 having a wavelength of 485 nm was emitted from the MQW layer 107, green light E2 having a wavelength of 565 nm was emitted from the first light emitting layer 304, and red light E3 having a wavelength of 620 nm was emitted from the second light emitting layer 302, so that white light was observed by the color mixture. The color temperature of white light was about 6500 K. The luminous intensity during the injection of a current of 20 mA was 2 cd in a package having a radiation angle of 10 degrees.

Even in the case of the semiconductor white light emitting device for obtaining white light by the color mixture of blue light E1, green light E2 and red light E3, it is possible to reduce the variation in tone in each device and the variation in tone due to deterioration with age, as in the case with the first preferred embodiment.

In the device of FIG. 5, the blue light E1 is emitted by the current injection, whereas the green light E2 and the red light E3 are emitted by optical pumping. Therefore, the variation in tone in each device due to the lost balance of current injection doe not occur. For example, in a case where a current is injected into each of the blue light emitting active layer, the green light emitting active layer and the red light emitting active layer to obtain white light, when the quantity of the current injected into the blue light emitting active layer increases due to the lost balance of current injection, the tone is caused to near to blue. However, in the device of FIG. 5, such a variation in tone in each device does not occur.

Figure 6:
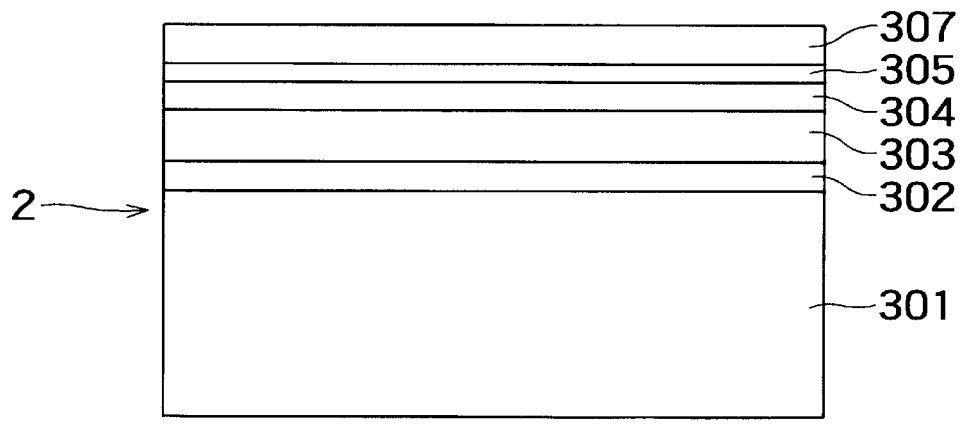
FIG. 6 is a schematic sectional view showing a method for manufacturing the third preferred embodiment of a semiconductor light emitting device according to the present invention.

Referring to FIG. 6, a method for manufacturing the semiconductor white light emitting device of FIG. 5 will be described below. As shown in FIG. 6, one of the features of this manufacturing method is that a first light emitting layer 304 and a second light emitting layer 302 are formed on a GaAs substrate 301 suitable for the formation of the light emitting layers 304 and 302, and thereafter, this is bonded to a semiconductor light emitting device 1.

FIG. 6 shows the structure of the semiconductor laminate 2 in the second preferred embodiment before the bonding. This will be specifically described in accordance with manufacturing steps.

First, a GaAs substrate 301 is cleaned with an organic solvent and/or a sulfuric acid containing etchant, and then, the substrate is introduced into an MOCVD system. Then, the substrate is heated to 730° C., and an appropriate 5-Group material serving as a P material is supplied to sequentially crystal-grow a second light emitting layer 302 of an InAlP/InGaAlP multilayer film, a first InAlP cladding layer 303, a first light emitting layer 304 of an InAlP/InGaAlP multilayer film, and a second InAlP cladding layer 305 to further grow a GaAs cap layer 307 on the surface thereof to obtain a stacked structure shown in FIG. 6. The GaAs cap layer 307 is a protection layer which is ultimately removed.

The thickness of these crystalline layers are shown in Table 3.

TABLE 3

| | |
|---|---|
| InAlP/InGaAlP Light Emitting Layer 302 | 30 nm/50 nm |
| InAlP Cladding Layer 303 | 500 nm or less |
| InAlP/InGaAlP Light Emitting Layer 304 | 30 nm/50 nm |
| InAlP Cladding Layer 305 | 300 nm or less |
| GaAs Cap Layer 307 | 100 nm |

Specifically, the second light emitting layer 302 has a structure wherein 20 InAlP layers having a thickness of 30 nm and 20 $In_{0.5}(Ga_{0.8}A_{0.2})_{0.5}P$ layers having a thickness of 50 nm are alternately stacked. The first light emitting layer 304 has a structure wherein 20 InAlP layers having a thickness of 30 nm and 20 $In_{0.5}(Ga_{0.5}Al_{0.4})_{0.5}P$ layers having a thickness of 50 nm are alternately stacked. The InAlP contact layer 305 serves both as an adhesive layer for bonding the semiconductor laminate 2 to the semiconductor light emitting element 1 and as a protection layer for protecting the light emitting layer 304, and at the same time, also have the function of confining light in the light emitting layer 304.

Then, the cap layer 307 of the semiconductor laminate 2 thus manufactured is removed, and the semiconductor laminate 2 is bonded to the semiconductor light emitting element 1 as in the case with the first preferred embodiment. Then, the GaAs substrate 301 is etched to be removed, and a protection layer 306 is formed on the surface thus etched, so that the device structure of FIG. 5 is obtained.

In the above described method for manufacturing the semiconductor light emitting device of FIG. 5, as in the case with the first preferred embodiment, the light emitting layers 302 and 304 are formed on the top of the GaAs substrate 301 suitable for the formation of the light emitting layers 302 and 304, and thereafter, this is bonded to the semiconductor blue light emitting element 1, so that it is possible to provide a semiconductor white light emitting device which has a small number of crystal defects in the light emitting layers 302 and 304 and which thus has high reliability.

In the method for manufacturing the device wherein the semiconductor laminate 2 is provided on the side of the light emitting surface, as shown in FIG. 5, it is possible to prevent light from being absorbed into the GaAs substrate 301 by etching and removing the GaAs substrate 301, so that it is possible to enhance the emission luminance of the device.

In the method for manufacturing the semiconductor light emitting device of FIG. 5, the semiconductor light emitting element 1 for emitting blue light E1 and the semiconductor laminate 2 for emitting green light E2 and red light E3 are integrated with each other by bonding to fabricate a single device. Therefore, the device can be used in a smaller space than that in a case where two or three devices are used, and the number of electrodes can be reduced. In addition, since the device can be regarded as a point light source by the integration, it is possible to provide a device having a small variation in emission.

Fourth Preferred Embodiment

Figure 7:
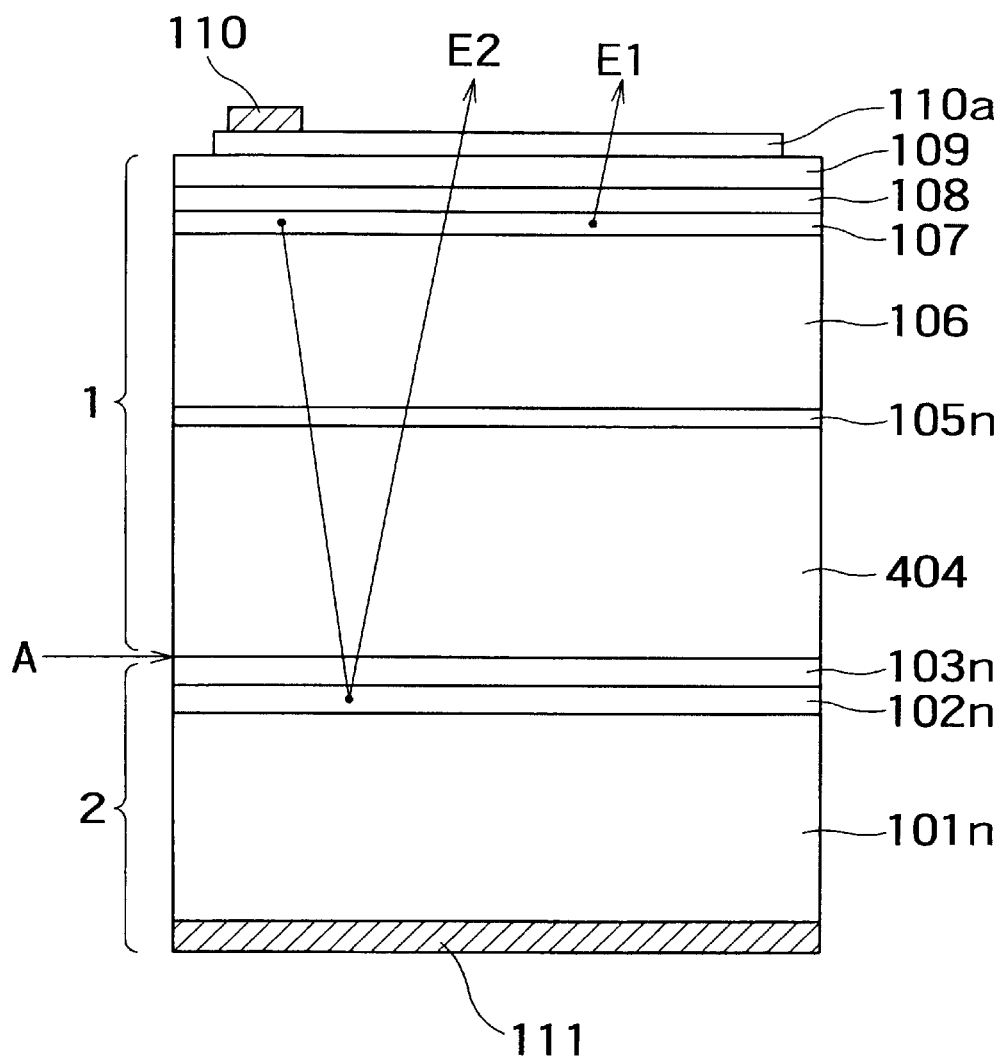
FIG. 7 is a schematic sectional view of the fourth preferred embodiment of a semiconductor light emitting device according to the present invention.

As can be seen from FIG. 7, one of different points of a semiconductor white light emitting device in the fourth preferred embodiment from the device in the first preferred embodiment (FIG. 1) is that an n-type semiconductor substrate 404 such as an n-type GaN, n-type SiC, n-type Si substrate is used as the substrate of a semiconductor light emitting element 1, and that an n-type electrode 111 is formed on the reverse surface of the substrate 101n of a semiconductor laminate 2. In the device of FIG. 7, a current is injected from the n-side electrode 111 into an active layer 107 via an n-type GaAs substrate 101n, a light emitting layer 102n of an n-type InAlP/InGaAlP multilayer film, an n-type InAlP cladding layer 103n, an n-type semiconductor substrate 404, an n-type AlGaN buffer layer 105n and a GaN contact layer 106. Other principal structures are the same as those in the first preferred embodiment.

Even in the case of the semiconductor light emitting device wherein the electrodes are provided on the top and bottom as shown in FIG. 7, it is possible to reduce the variation in tone in each device and the variation in tone due to deterioration with age, as in the case with the first preferred embodiment.

Even in the case of the device of FIG. 7, it is possible to use a manufacturing method which is substantially the same as that in the first preferred embodiment (FIG. 1), and it is possible to obtain a device having high reliability, as in the case with the first preferred embodiment. Moreover, in the case of the device of FIG. 7, an etching step of forming an n-side electrode is not required to carry out, so that the manufacturing method is simplified.

Fifth Preferred Embodiment

Figure 8:
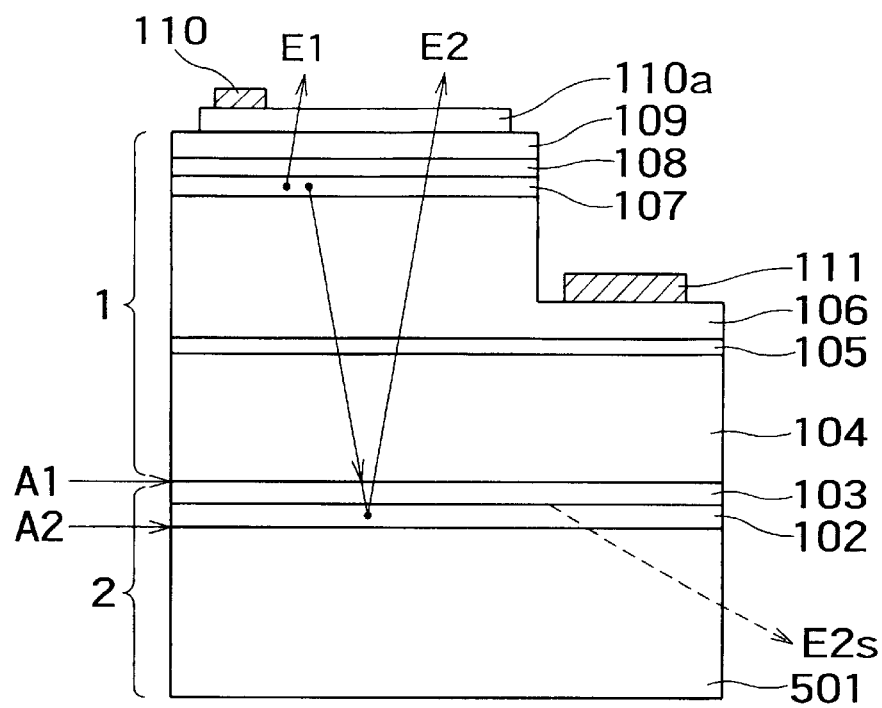
FIG. 8 is a schematic sectional view of the fifth preferred embodiment of a semiconductor light emitting device according to the present invention.

As can be seen from FIG. 8, one of different points of a semiconductor white light emitting device in the fifth preferred embodiment from the device in the first preferred embodiment (FIG. 1) is that the non-transparent GaAs substrate 101 of a semiconductor laminate 2 is etched to be removed and that another transparent substrate 501 is bonded to a bonding surface A2. Specifically, a GaP substrate or ZnSe substrate for transmitting yellow light is used as the transparent substrate 501. Other principal structures are the same as those in the first preferred embodiment. Furthermore, the bonding surface A in the first preferred embodiment (FIG. 1) corresponds to the bonding surface A1 in the fifth preferred embodiment (FIG. 8).

In the device of FIG. 8, yellow light E2s emitted from an InAlP/InGaAlP light emitting layer 102 can also be emitted from the side of the newly bonded substrate 501 as shown by a broken line. Therefore, if, for example, when the inner wall surface of a package is formed as a recessed surface to emit the radiation E2s upward, the radiation E2s can be effectively utilized.

In the above described first through fifth preferred embodiments, an InAlP layer 103 was used as a cladding layer (also serving as a contact layer) for bonding the light emitting layer 102 of a semiconductor laminate 2 to a semiconductor light emitting element 1. On the top of the InAlP cladding layer 103, a cladding layer of another material may be formed in place of the cladding layer 103. Such a cladding layer may be made of, e.g., GaN or GaP. By providing such a cladding layer, the light confining effect in a multilayer film 102 can be enhanced. A GaN cladding layer is particularly preferable since it transmits blue light, though it is a polycrystalline thin film. In accordance with the material of a substrate to be bonded, GaAlAs or InGaAlP may be used.

Although etching and/or polishing was used as a pretreatment before bonding, gas etching or thermal cleaning in various amorphous gases may be carried out. Moreover, the annealing atmosphere and temperature can be suitably changed. When a high annealing temperature is used, an atmosphere gas may be selected to apply a suitable pressure in order to prevent atoms from being emitted and removed from crystal.

For bonding, an adhesive may be used. For example, if an adhesive is used in the device in the fifth preferred embodiment (FIG. 5), setting the refractive index of the adhesive to be at a value between the refractive index of the sapphire substrate 104 and the refractive index of the InAlP cladding layer, enables the reduction in quantities of blue light E1 and yellow light E2 reflected on the bonding surface Al, so that it is possible to enhance the emission luminance of the device.

Sixth Preferred Embodiment

Figure 9:
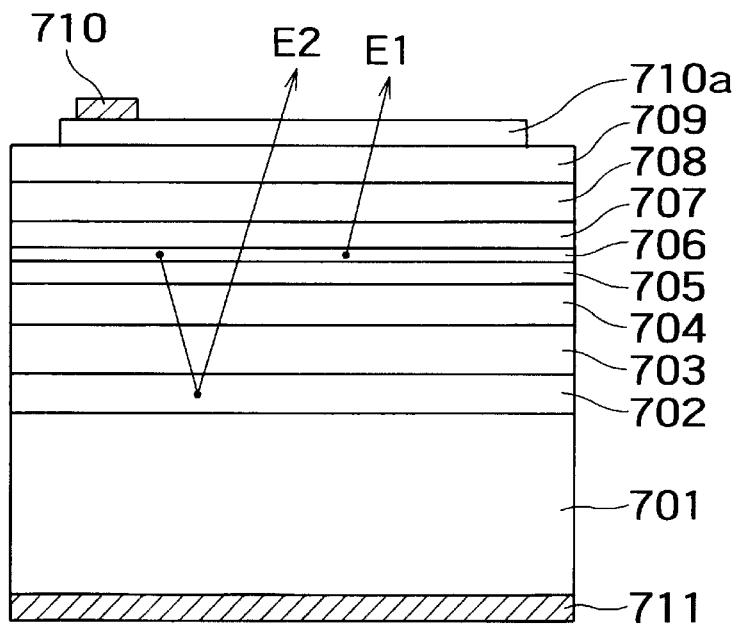
FIG. 9 is a schematic sectional view of the sixth preferred embodiment of a semiconductor light emitting device according to the present invention.

FIG. 9 is a schematic sectional view of the sixth preferred embodiment of a semiconductor white light emitting device according to the present invention. Unlike the preceding preferred embodiments wherein the semiconductor light emitting device is bonded to the semiconductor laminate, a light emitting layer 702 and an active layer 706 in this preferred embodiment, are formed on an n-type GaAs substrate 701 by crystal growth. That is, on the n-type GaAs substrate 701, there are sequentially stacked an n-type InAlP/InGaAlP light emitting layer 702 for emitting yellow light E2 by optical pumping, an n-type ZnSe buffer layer 703, an n-type ZnMgSSe cladding layer 704, an n-type ZnSe optical guiding layer 705, a ZnSe/ZnCdSe MQW active layer 706 for emitting blue light E1 by current injection, a p-type ZnSe optical guiding layer 707, a p-type ZngSSe cladding layer 708, and a p-type ZnTe/ZnSe superlattice contact layer 709. On the p-type contact layer 709, a p-side transparent electrode 710a and a p-side electrode 710 are formed, and on the n-type GaAs substrate 701, an n-side electrode 711 is formed.

For the crystal growth of the device of FIG. 9, the MOCVD method and the MBE method are combined. That is, the MOCVD method is used for the crystal growth of the n-type InalP/InGaAlP light emitting layer 702 on the n-type GaAs substrate 701, and the MBE method was used for the growth of the n-type ZnSe buffer layer 703 to the p-type ZnTe/ZnSe superlattice contact layer 709 thereon. This is because a good conductive type control can be achieved by using the MBE method particularly for ZnSe compound p-type conductive layers.

In the semiconductor white light emitting device thus formed, blue light E1 is emitted from the active layer 706 by passing a current between the electrodes 710 and 711. A part of the blue light E1 passes through the element to be absorbed into the light emitting layer 702 to excite yellow light E2. This yellow light E2 is emitted from the top side in the figure. By the hybridization of the blue light E1 and yellow light E2, white light is obtained.

In fact, white light was observed by the color mixture of blue light E1 having a wavelength of 485 nm and yellow light E2 having a wavelength of 590 nm. The color temperature of the white light was about 8000 K, and the luminous intensity during the injection of a current of 20 mA was 2 cd in a package having a radiation angle of 10 degrees.

Even in the case of the above described semiconductor light emitting device of FIG. 9 using the ZnSe compound semiconductor light emitting element 1, it is possible to reduce the variation in tone in each device and the variation in tone due to deterioration with age, as in the case with the first preferred embodiment.

A method for manufacturing the device of FIG. 9 will be briefly described below. First, an n-type GaAs substrate 701 is cleaned with an organic solvent and/or a sulfuric acid containing etchant, and then, the substrate is introduced into an MOCVD system. Then, the substrate is heated to 730° C., and an appropriate 5-Group material serving as a P material is supplied to grow an n-type InAlP/InGaAlP light emitting layer 702. Then, the substrate is transferred to an MBE system to grow thereon an n-type ZnSe buffer layer 703 to a p-type ZnTe/ZnSe superlattice contact layer 709. Specifically, the n-type InAlP/InGaAlP light emitting layer 702 was formed so as to have a structure wherein 20 InAlP layers and 20 $In_{0.5}(Ga_{0.7}Al_{0.3})_{0.5}P$ layers are alternately stacked.

As described above, in the semiconductor light emitting device of FIG. 9, the n-type InAlP/InGaAlP light emitting layer 702 and the ZnSe/ZnCdSe MQW active layer 706 are formed on the n-type GaAs substrate 701 by crystal growth, so that it is possible to simplify the manufacturing process.

In addition, since the lattice constant of the ZnSe compound semiconductor is close to the lattice constant of the GaAs compound semiconductor, even if the above described crystal growth is carried out, it is possible to provide a semiconductor white light emitting device which has a small number of crystal defects and which has high reliability.

Seventh Preferred Embodiment

Figure 10:
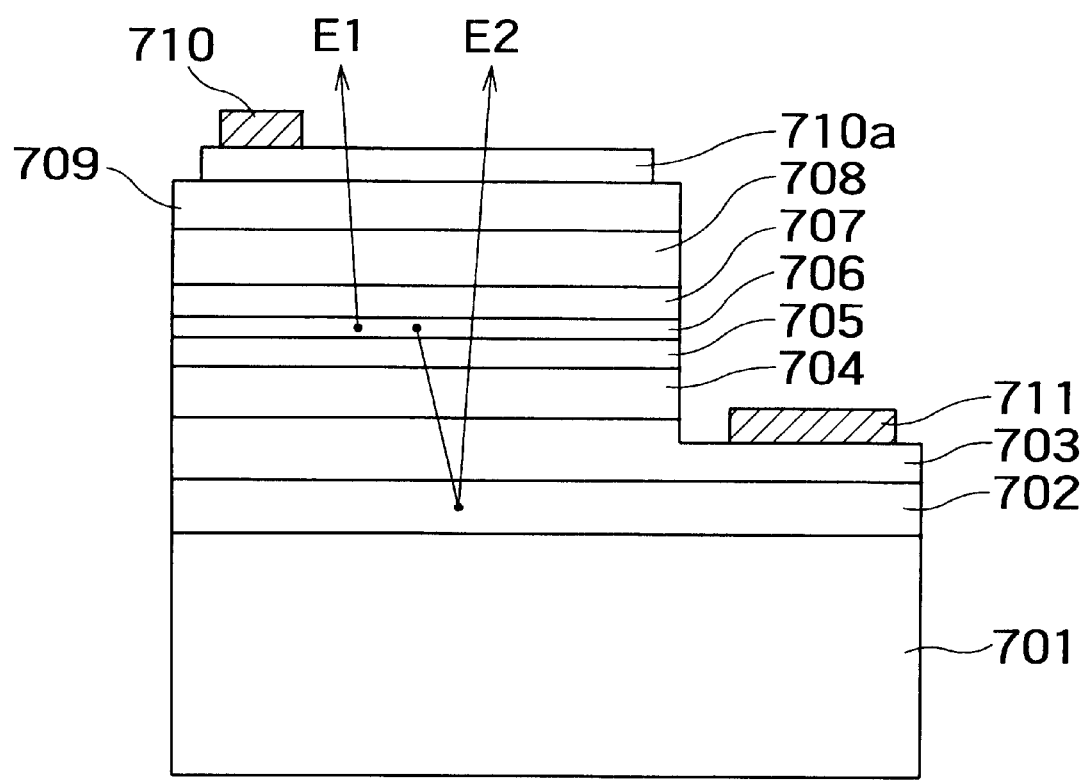
FIG. 10 is a schematic sectional view of the seventh preferred embodiment of a semiconductor light emitting device according to the present invention.

As can be seen from FIG. 10, one of different points of a semiconductor white light emitting device in the seventh preferred embodiment from the device in the sixth preferred embodiment (FIG. 9) is that etching is carried out from the side of a p-type contact layer 709 to expose an n-type buffer layer 703 and that an n-side electrode 711 is formed on the n-type buffer layer 703. Other principal constructions are the same as those in the sixth preferred embodiment.

Even in the case of the device of FIG. 10, it is possible to obtain white light by color mixture as in the case with the sixth preferred embodiment, so that it is possible to obtain the same advantages as those in the sixth preferred embodiment.

While the InGaAlP materials semiconductors and the ZnSe compound semiconductors have been crystal-grown by the MOCVD method and the MBE method, respectively, in the sixth and seventh preferred embodiments, both may be crystal-grown by the MBE method. Also in the case of the material system in the sixth and seventh preferred embodiments, two light emitting layers may be formed on separate element substrates, respectively, to bond and integrate the substrates with each other as in the case with the first preferred embodiment.

Eighth Preferred Embodiment

In the following eighth through eleventh preferred embodiments, there will be described a device wherein a semiconductor laminate 2 having a double-hetero structure is bonded to a part of a light emitting surface of a GaN compound semiconductor light emitting element 1 or a part of the opposite surface thereto, as shown in, e.g., FIG. 11. Furthermore, in the following preferred embodiments, the detailed description of the manufacturing process is omitted.

Figure 11:
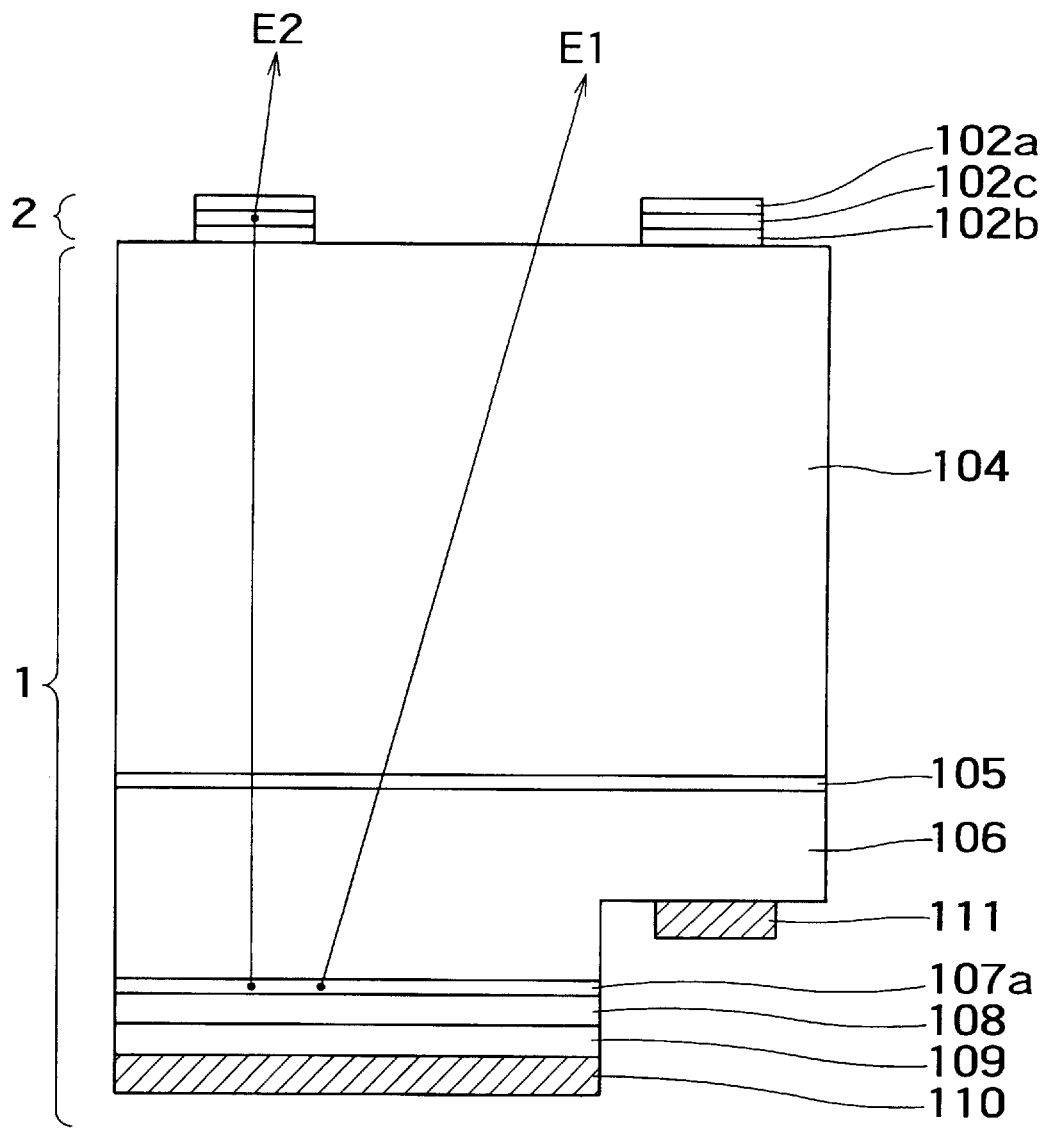
FIG. 11 is a schematic sectional view of the eighth preferred embodiment of a semiconductor light emitting device according to the present invention.

FIG. 11 is a schematic sectional view showing the eighth preferred embodiment of a semiconductor white light emitting device according to the present invention. The same reference numbers are given to elements corresponding to those in the first preferred embodiment (FIG. 1). A semiconductor white light emitting device comprises a semiconductor light emitting element 1 for emitting blue light E1 by current injection, and a semiconductor laminate 2 excited by the blue light E1 for emitting yellow light E2. As can be seen from FIG. 12, these light beams are emitted from the top side in the figure.

First, the semiconductor light emitting element 1 will be described. On the bottom face of a sapphire substrate 104 in the figure, there are sequentially formed a buffer layer 105, an n-type GaN cladding layer 106, an InGaAlN active layer 107a, a p-type AlGaN cladding layer 108 and a p-type GaN contact layer 109. Although the thickness of each of the layers 104 to 109 is several $\mu$m and the thickness of the sapphire substrate 104 is hundreds $\mu$m, the scale factor thereof is changed in FIG. 11 for the purpose of easier explanation of the stacked layers 104 through 109.

The wavelength of light emitted from the above described InGaAlN active layer 107 is designed to emit blue light E1 by controlling the composition ratio of In and Al of the active layer. The composition ratio of Al may be 0 so that the active layer is made of InGaN. If this active layer 107a has a single-quantum well or multi-quantum well structure of a thin film having a thickness of about 1 nm to 10 nm, it is possible to realize high luminance. A current is injected into the active layer 107a from an n-side electrode 111, which is formed on the n-type cladding layer 106, and from a p-side electrode 110 which is formed on the p-type contact layer 109. The p-side electrode 110 and the n-side electrode 111 are preferably made of Ni/Au and Ti/Al, respectively, which are materials having a high reflectance for reflecting blue light emitted from the active layer 107a. Thus, the blue light E1 emitted from the active layer 107a downward in the figure can be reflected on the p-side electrode 110 and the n-side electrode 111 to be emitted from the light emitting surface on the top side in the figure. Furthermore, the portions shown by slant lines in the figure, such as the p-side electrode 110 and the n-side electrode 111, are the portions having the property of reflecting the blue light E1 and the yellow light E2.

The semiconductor laminate 2 will be described below. The semiconductor laminate 2 has a structure wherein an InGaAlP light emitting layer 102c is located between a p-type InGaAlP cladding layer 102b and an n-type InGaAlP cladding layer 102a. The light emitting layer 102c is designed to emit the yellow light E2 by controlling the composition ratio of 3-Group elements, In, Ga and Al, of InGaAlP. The thickness of the light emitting layer 102 is preferably in the range of from 1 nm to 10 nm. That is, when the light emitting layer 102c has a single-quantum well or multi-quantum well structure of a thin film having a thickness of one nm to tens nm, the luminous efficiency of yellow light increases to increase the intensity of yellow light, and when the light emitting layer 102c is made of a single layer or multilayer film having a thickness of tens nm to 10 $\mu$m, the absorption efficiency of blue light increases to increase the intensity of yellow light. The two cladding layers 102a and 102b on both sides of the light emitting layer 102c have a greater band gap than the light emitting layer 102c. That is, the semiconductor laminate 2 has a double-hetero structure. Because of the double-hetero structure, electrons and holes generated by the blue light E1 emitted from the semiconductor light emitting element 1 can be effectively confined in the light emitting layer 102c, so that the luminous efficiency of the yellow light E2 can increase to increase the emission luminance of the yellow light E2. Also, because of the double-hetero structure, the emission luminance of the yellow light E2 increases even if the light emitting layer 102c is made of a single layer film. If the cladding layers for locating the light emitting layer 102c are p-type and n-type cladding layers as in this preferred embodiment, the intensity of the yellow light E2 of the light emitting layer 102c further increases. This results was obtained by the inventors experiment. It is analyzed that the reason for this is that the absorption efficiency is increased by the internal field. No element may be doped into the cladding layers 102a and 102b. In the case of such undoping, the crystalline characteristics of the light emitting layer 102c are improved, i.e., the non-emission center of the light emitting layer 102 decreases, and the intensity of the yellow light E2 in the light emitting layer 102c increases.

When the semiconductor laminate 2 having the double-hetero structure is used as in the device of FIG. 11, the area of the semiconductor laminate 2 is preferably set to be ⅓ to ⅔ of the area of the sapphire substrate 104 on the top side in the figure. That is, as described above, when the semiconductor laminate 2 has the double-hetero structure, the intensity of the yellow light E2 increases. However, if the double-hetero structure is used, the n-type cladding layer 102a absorbs the blue light E1, so that the intensity of the blue light E1 decreases. Therefore, when the semiconductor laminate 2 is the double-hetero structure and when the area of the semiconductor laminate 2 has the same as that on the top side in the figure, the intensity of the yellow light E2 is too strong, so that the tone of white light is caused to approach yellow. Therefore, if the area of the semiconductor laminate 2 is set to be ⅓ to ⅔ of the area of the sapphire substrate, it is possible to obtain white light having a good balance.

The thickness of the above described p-type cladding layer 102b is preferably 300 nm or less, and more preferably 100 nm or less. The reason for this is that the quantity of blue light E1 for exciting the light emitting layer 102c decreases when the p-type cladding layer 102b is too thick since the p-type cladding layer 102b has the property of absorbing blue light E1. On the other hand, since the n-type cladding layer 102a has the property of transmitting yellow light E2, its thickness may be increased if necessary.

As shown in FIG. 11, the semiconductor laminate 2 is bonded to a part of the top side of the sapphire substrate 104 of the semiconductor light emitting element 1 in the figure. For example, this semiconductor laminate 2 may be formed by sequentially forming the n-type cladding layer 102a, the light emitting layer 102c and the p-type cladding layer 102b on the GaAs substrate, heat-treating the substrate at a temperature of 460° C. to 750° C. in an atmosphere of an inert gas, bonding the p-type cladding layer 102b on the top side of the sapphire substrate 104 in the figure, and etching and removing the GaAs substrate.

In the above described semiconductor light emitting element 1 and semiconductor laminate 2, blue light E1 is emitted from the active layer 104 of the semiconductor light emitting element 1, and a part of the blue light E1 is incident on the semiconductor laminate 2. The incident blue light E1 excites the light emitting layer 102c of the semiconductor laminate 2, so that yellow light E2 is emitted from the light emitting layer 102. Thus, the blue light E1 emitted from the active layer 107 and the yellow light E2 emitted from the light emitting layer 102c are mixed to realize white light.

Figure 12:
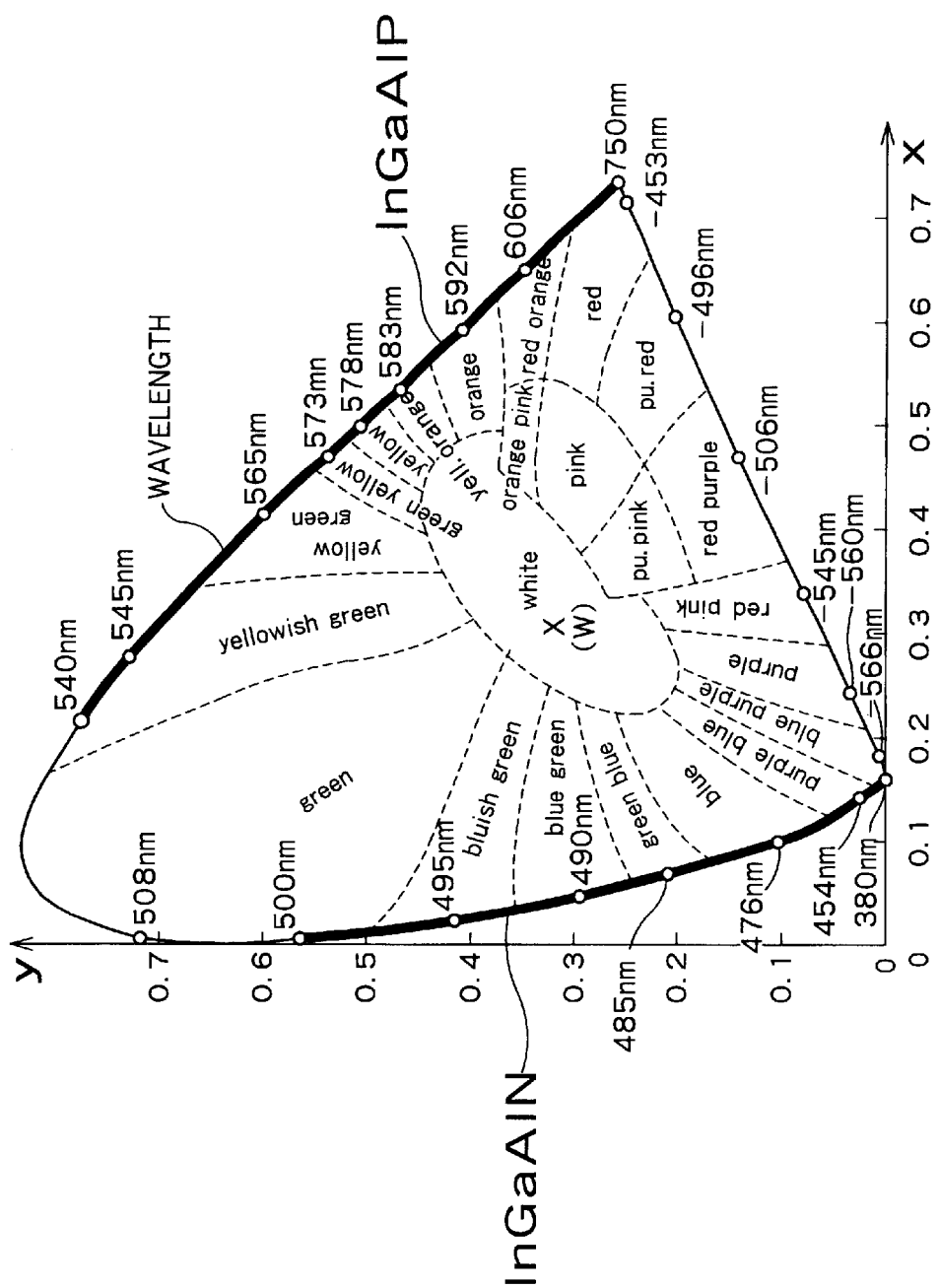
FIG. 12 is a chromaticity diagram for explaining the chromaticity of the eighth preferred embodiment of a semiconductor light emitting device according to the present invention, which is an xy chromaticity diagram defined by International Commission on Illumination (CIE)

Referring to the chromaticity diagram of FIG. 12, this white light will be described below in detail. FIG. 12 is an xy chromaticity diagram defined by International Commission on Illumination (CIE). The emission wavelength of an InGaAlN active layer, such as the active layer 107a of the semiconductor light emitting element 1 of FIG. 11, can be in the range of from 380 nm to 500 nm as shown on the left side of FIG. 12. The emission wavelength of an InGaAlP light emitting layer, such as the light emitting layer 102c of the semiconductor laminate 2, can be in the range of from 540 nm to 750 nm as shown on the right side of FIG. 12. If for example, the color mixture of blue light having a wavelength of 476 nm emitted from the InGaAlN active layer with yellow light having a wavelength of 578 nm emitted from the InGaAlP light emitting layer is intended to be carried out, a straight line drawn between a white circle of 476 in the lower-left blue region and a white circle of 578 in the upper-right yellow region is considered. Then, it can be seen that this straight line passes through a white region. It can thus be seen from FIG. 12 that white light can be realized by the color mixture of the blue light emitted from the semiconductor light emitting element 1 and the yellow light E2 emitted from the semiconductor laminate 2.

Similarly, it can be seen from FIG. 12 that white light can be realized by the color mixture of bluish green light with red light when the emission wavelength of the InGaAlN active layer 107a is set to be 495 nm and the emission wavelength of the InGaAlP light emitting layer 102c is set to be 750 nm.

In the above described semiconductor of FIG. 11, it is possible to decrease the variation in tone in each device. This is because unlike fluorescent material, the thickness, composition, and other characteristics and area of the semiconductor laminate 2 hardly vary in each element. That is, by using a standardized mass production process generally used for the manufacturing of semiconductor elements, the semiconductor laminate 2 can be manufactured with high repeatability so that the thickness, composition and other characteristics hardly vary, and can be easily worked so as to have the same area. Then, when the thickness, composition, and other characteristics and area of the semiconductor laminate 2 are uniform for each element, the ratio of the blue light E1 emitted from the semiconductor light emitting element 1 to the yellow light E2 emitted from the semiconductor laminate 2 does not vary for each element, so that the tone does not vary for each element.

In the semiconductor light emitting device of FIG. 11, the tone can also be adjusted by changing the area of the semiconductor laminate 2. Because of this, when the luminous efficiency of the semiconductor laminate 2 varies for some reason or other, for example, the tone can be adjusted. In a simple manner, the luminous efficiency of the semiconductor laminate 2 decreases, the area of the semiconductor laminate may be increased.

Also, it is necessary to change the tone of white light is intended, the tone can be easily changed by changing the area of the semiconductor laminate 2 as described above. For example, when an element for emitting white light having a tone close to blue is intended to be manufactured as a displaying element, the area of the semiconductor laminate 2 for emitting yellow light may be decreased.

Moreover, in the semiconductor light emitting device of FIG. 11, it is possible to further improve the emission luminance than that in conventional elements. That is, since the semiconductor laminate 2 is formed only on a part of the light emitting surface in the element of FIG. 11, it is possible to utilize blue light which does not pass through the semiconductor laminate 2 serving as a wavelength converting region, i.e., blue light having a high luminance directly emitted from the semiconductor light emitting element 1, so that it is possible to improve the emission luminance.

Ninth Preferred Embodiment

Figure 13:
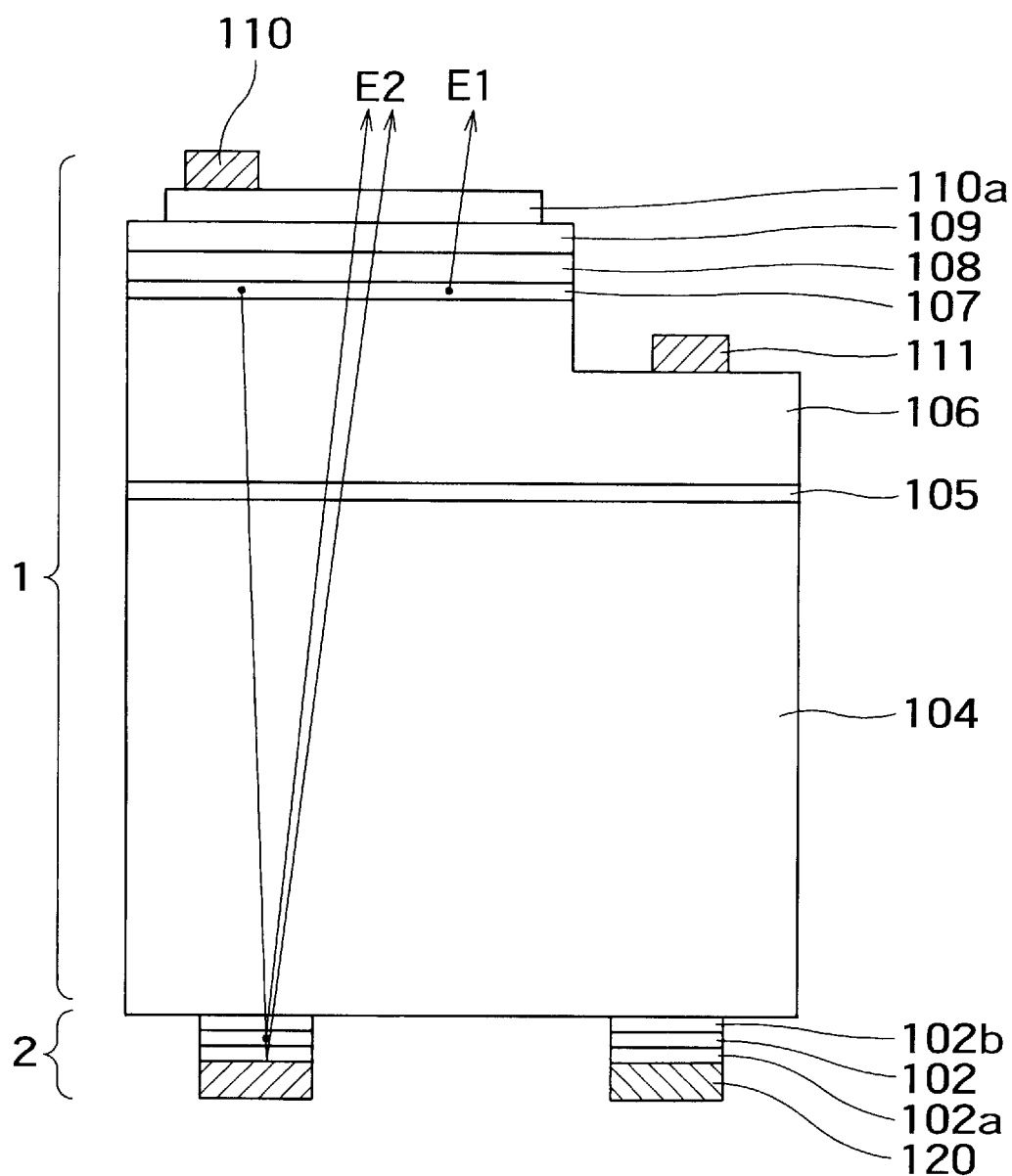
FIG. 13 is a schematic sectional view of the ninth preferred embodiment of a semiconductor light emitting device according to the present invention.

As can be seen from FIG. 13, one of different points of the ninth preferred embodiment from the eighth preferred embodiment is that a light emitting surface is arranged on the side of a p-type contact layer 109.

FIG. 13 is a schematic sectional view of the ninth preferred embodiment of a semiconductor white light emitting device according to the present invention. As in the case with the eighth preferred embodiment (FIG. 11), a semiconductor white light emitting device comprises a semiconductor light emitting element 1 for emitting blue light E1 from an active layer 107 by current injection, and a semiconductor laminate 2 excited by the blue light E1 for emitting yellow light E2 from a light emitting layer 102. These light beams are emitted from the light emitting surface on the top side in the figure.

First, the structure of the semiconductor light emitting element 1 is basically the same as that in the first preferred embodiment (FIG. 1), so that the detailed description thereof is omitted.

The semiconductor laminate 2 will be described below. The semiconductor laminate 2 has a structure wherein a light emitting layer 102 of an InAlP/InGaAlP multilayer film is located between a p-type InGaAlP cladding layer 102b and an n-type InGalP cladding layer 102a. On the bottom side of the n-type cladding layer 102a, a reflecting film 120 for reflecting yellow light emitted from the light emitting layer 102 is formed. This reflecting film may be made of a metal film of Al, Ag, Au or Cu or an alloy thereof, and have a thickness of 0.1 μm to 10 μm. Thus, the yellow light E2 emitted from the light emitting layer 102 downward in the figure can be reflected on the reflecting film 120 to be emitted from the light emitting surface. The semiconductor laminate 2 thus manufactured is bonded to a part of the bottom face (second face) in the figure of the sapphire substrate 104 of the semiconductor light emitting element 1.

Even if the light emitting surface is arranged on the side of the p-type contact layer 109 as in this preferred embodiment, the same advantages as those in the eighth preferred embodiment can be obtained.

Tenth Preferred Embodiment

Figure 14:
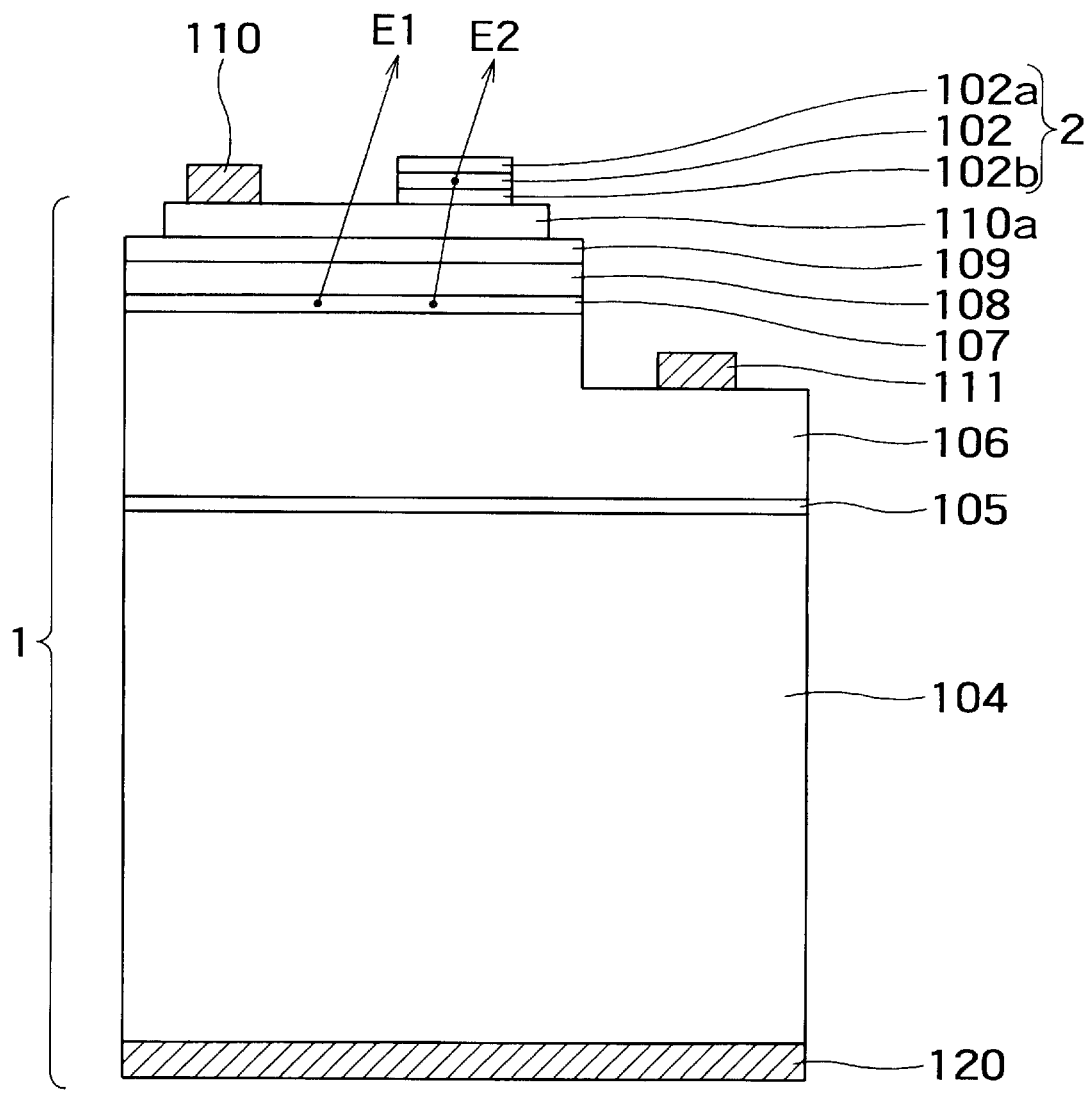
FIG. 14 is a schematic sectional view of the tenth preferred embodiment of a semiconductor light emitting device according to the present invention.

As can be seen from FIG. 14, one of different points of the tenth preferred embodiment from the ninth preferred embodiment is that a semiconductor laminate 2 is formed on the side of a light emitting surface on the top side in the figure.

FIG. 14 is a schematic sectional view of the tenth preferred embodiment of a semiconductor white light emitting device according to the present invention. As in the case with the ninth preferred embodiment (FIG. 13), a semiconductor white light emitting device comprises a semiconductor light emitting element 1 for emitting blue light E1 from an active layer 107 by current injection, and a semiconductor laminate 2 excited by the blue light E1 for emitting yellow light E2 from a light emitting layer 102. As can be seen from FIG. 14, the light emitted from this device is emitted from the light emitting surface on the top side in the figure.

First, the semiconductor light emitting element 1 will be described. One of different points of the semiconductor light emitting element 1 from that in the ninth preferred embodiment (FIG. 13) is that a reflecting layer 120 for reflecting blue light E1 emitted from an active layer 107 and yellow light E2 emitted from a light emitting layer 102 is formed on the bottom side of a sapphire substrate 104. This reflecting film may be made of a metal film of Al, Ag, Au or Cu or an alloy thereof, and have a thickness of 0.1 μm to 10 μm. Thus, the blue light E1 emitted from the active layer 107 downward in the figure and the yellow light E2 emitted from the light emitting layer 102 downward in the figure can be reflected on the reflecting film 120 to be emitted from the light emitting surface on the top side in the figure. Other principal structures are the same as those in the ninth preferred embodiment (FIG. 9).

The semiconductor laminate 2 will be described below. As in the case with the ninth preferred embodiment, the semiconductor laminate 2 has a structure wherein the light emitting layer 102 of an InAlP/InGaAlP multilayer film is located between a p-type InGaAlP cladding layer 102b and an n-type InGaAlP cladding layer 102a. This semiconductor laminate 2 is bonded to the top of a p-side transparent electrode 110a of the semiconductor light emitting element 1. As in the case with the eighth preferred embodiment, a heat treatment is carried out in an atmosphere of an inert gas during bonding. However, as a result of the inventors' experiment, the bonding temperature for the semiconductor laminate 2 may be in the range of from 150° C. to 450° C. although the bonding temperature in the eighth embodiment is in the range of from 460° C. to 750° C. That is, as a result of the inventors' experiment, it was found that if the semiconductor laminate 2 was bonded to the top of the transparent electrode 109, it is possible to bond it at a lower temperature than the case where it was bonded to the sapphire substrate 104, with the same bonding strength.

Even if the semiconductor laminate 2 is formed on the top of the transparent electrode 110a on the side of the light emitting surface as in the semiconductor light emitting device in this preferred embodiment, the same advantages as those in the ninth and eighth preferred embodiments can be obtained.

Since the semiconductor laminate 2 is bonded to the transparent electrode 110a in the semiconductor light emitting element in this preferred embodiment, it is possible to utilize reflection on the transparent electrode 110a, so that it is possible to more effectively extract yellow light emitted from the light emitting layer 102.

Eleventh Preferred Embodiment

Figure 15:
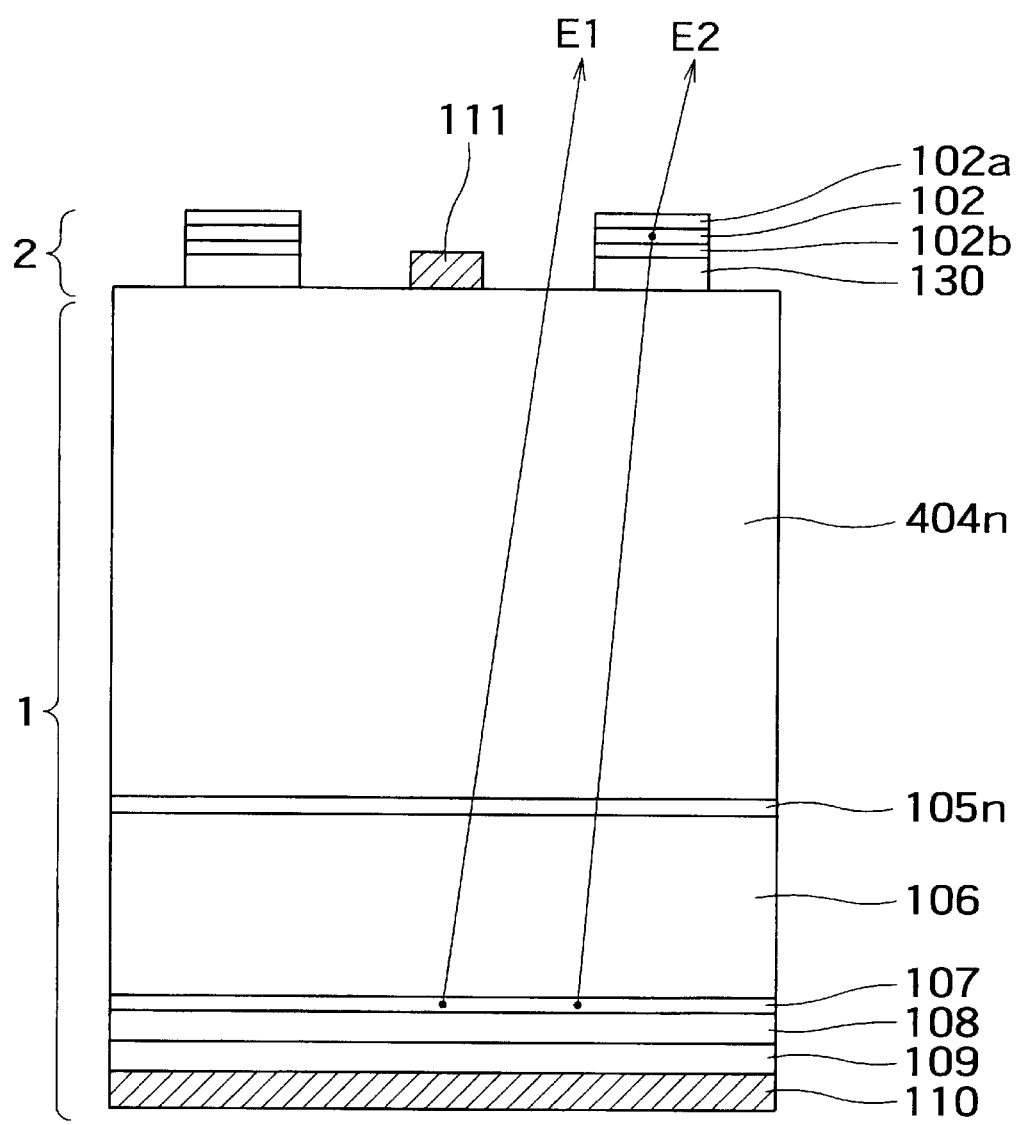
FIG. 15 is a schematic sectional view of the eleventh preferred embodiment of a semiconductor light emitting device according to the present invention.

As can be seen from FIG. 15, one of different points of the eleventh preferred embodiment from the eighth preferred embodiment (FIG. 11) is that an n-side electrode 111 is provided on the top of a substrate 404n using an n-type GaN substrate 404n and that a low-pass filter 130 is provided in a semiconductor laminate 2.

FIG. 15 is a schematic sectional view of the eleventh preferred embodiment of a semiconductor white light emitting device according to the present invention. Just like the eight preferred embodiment (FIG. 11), a semiconductor white light emitting device comprises the semiconductor light emitting element 1 for emitting blue light E1 from an active layer 107 by current injection, and a semiconductor laminate 2 excited by the blue light E1 for emitting yellow light E2 from a light emitting layer 102. The light emitted from this device is emitted from the light emitting surface on the top side in the figure.

First, the semiconductor light emitting element 1 will be described. On the bottom face of an n-type GaN substrate 404n in the figure, there are sequentially formed an n-type AlGaN buffer layer 105n, an n-type GaN cladding layer 106, an active layer 107 having a GaN/InGaN multi-quantum well structure, a p-type AlGaN cladding layer 108 and a p-type GaN contact layer 109. A current is injected into the active layer 107 from an n-side electrode 111 of Ti/Al or the like formed on the n-type GaN substrate 404n and from a p-type electrode 110 of Ni/Au or the like formed on the p-type contact layer 109. As described above, the buffer layer 105n is made of an n-type AlGaN since the current is injected into the active layer 107 via the buffer layer 105n from then-side electrode 110 provided on the substrate 404n in the element of FIG. 15.

Figure 16:
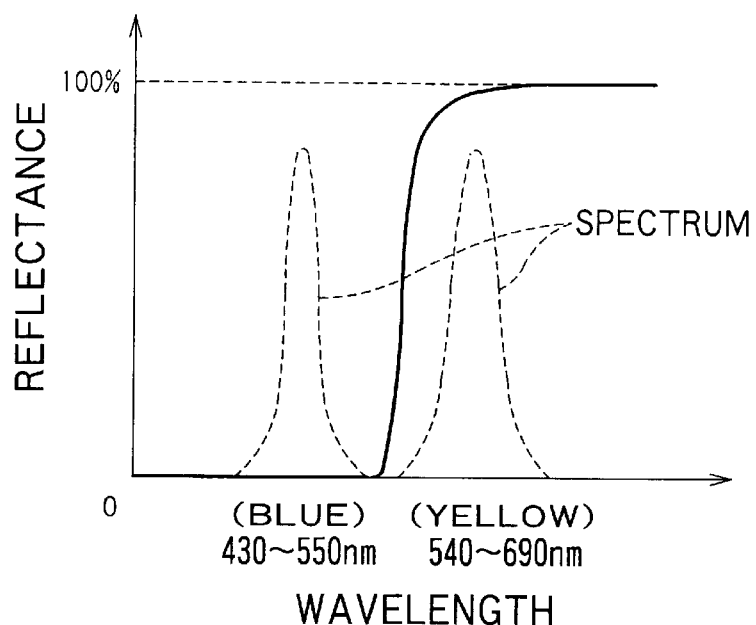
FIG. 16 is a characteristic diagram showing characteristic of a low-pass filter of the eleventh preferred embodiment of a semiconductors light emitting device according to the present invention.

The semiconductor laminate 2 will be described below. The semiconductor laminate 2 has a structure wherein the light emitting layer 102 of an InAlP/InGaAlP multilayer film is located between a p-type InGaAlP cladding layer 102b and an n-type InGaAlP cladding layer 102a. In addition, in the device of FIG. 15, the semiconductor laminate 2 is provided with the low-pass filter 130. As shown in FIG. 16, the low-pass filter 130 has a high reflectance with respect to the yellow light E2 emitted from the light emitting layer 102, and a low reflectance with respect to the blue light E1 emitted from the active layer 107. That is, the low-pass filter 130 has the property of reflecting the yellow light E2 emitted from the light emitting layer 102 and transmitting the blue light E1 emitted from the active layer 107. As in the case with the eighth preferred embodiment (FIG. 11), the semiconductor laminate 2 is bonded on the top side (the side of the second surface) of the substrate 404n of the semiconductor light emitting element 1 in the figure.

When the n-type GaN substrate 404n is used as a substrate as in the element in this preferred embodiment, the distortion due to the lattice unconformity between the substrate 404n and the crystal growth layers 105n through 109 including the active layer 107 is decreased, so that it is possible to realize a light emitting device having high reliability.

When the low-pass filter 130 is provided as in the device in this preferred embodiment, it is possible to efficiently extract yellow light emitted from the light emitting layer 107, so that it is possible to further enhance luminance.

While the n-type GaN substrate 404n has been used as the substrate in the above described eleventh preferred embodiment, an n-type SiC substrate may be used as in the fourth preferred embodiment. When the n-type SiC substrate is used, it is possible to realize a device which has good radiation characteristics and which does not decrease luminance even at a high temperature of higher than 80° C.

Twelfth Preferred Embodiment

In the following twelfth and thirteenth preferred embodiments, there will be described other semiconductor white light emitting devices which are relevant to the present invention and wherein the variation in tone in each device is small.

Figure 17:
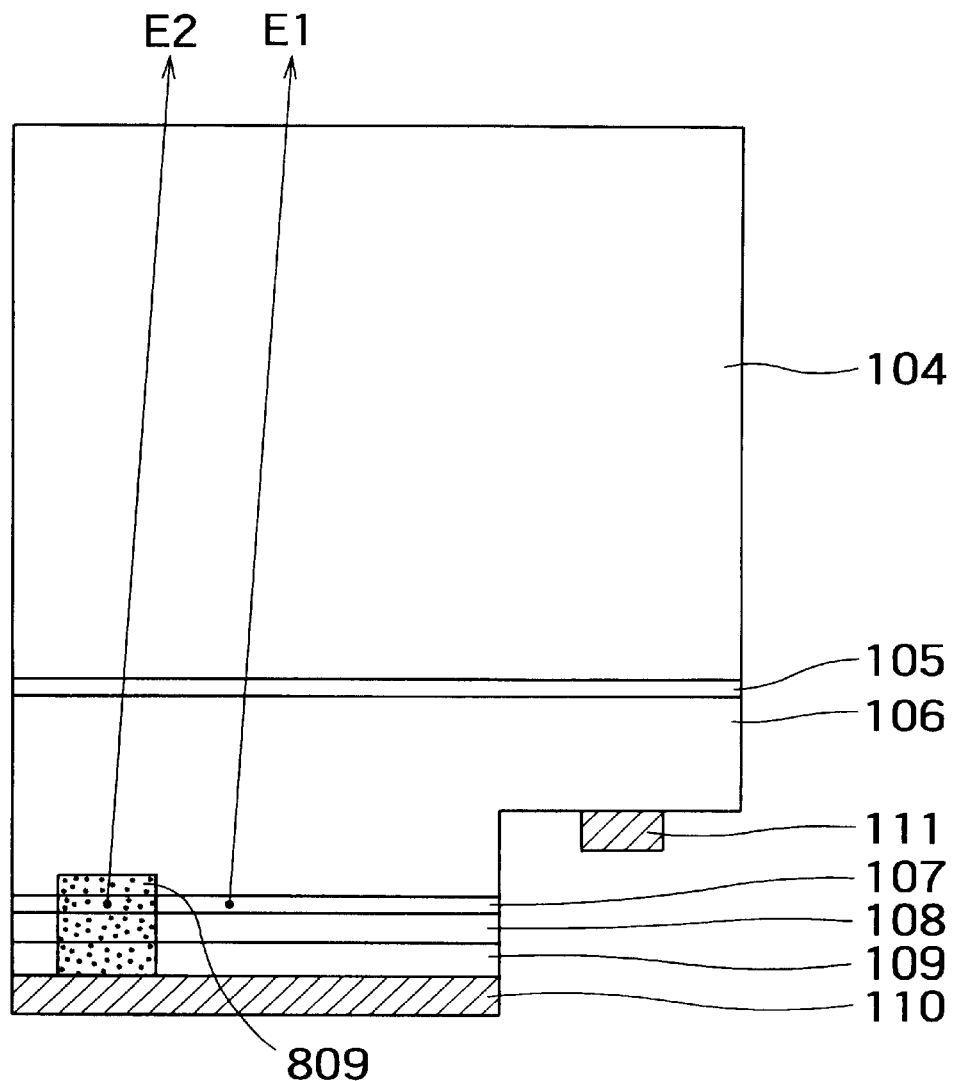
FIG. 17 is a schematic sectional view of the twelfth preferred embodiment of a semiconductor light emitting device according to the present invention.

As shown in FIG. 17, the twelfth preferred embodiment is characterized in that an ion implantation region 809 is provided in a part of an active layer 107.

FIG. 17 is a schematic sectional view showing the twelfth preferred embodiment of a semiconductor white light emitting device according to the present invention. On the bottom face of a sapphire substrate 104 in the figure, there are sequentially formed a buffer layer 105, an n-type GaN cladding layer 106, an active layer 107 having a GaN/InGaN multi-quantum well structure, a p-type AlGaN cladding layer 108 and a p-type GaN contact layer 109.

One of the features of this preferred embodiment is that the ion implantation region 809 is provided to form an ion implanted region in a part of the active layer 107. Ions in the ion implantation region 809 form the emission center in the active layer 107 to absorb blue light E1 to emit yellow light E2. The device of FIG. 17 realizes white light by the blue light E1 emitted from the active layer 107 and the yellow light E2 emitted from the ion implantation region 809. These light beams are emitted from the light emitting surface on the top side in the figure.

A current is injected into the above described active layer 107 from the n-side electrode 111 formed on the n-type cladding layer 106 and from the p-side electrode 110 formed on the p-type contact layer 109. The p-side electrode 110 and the n-side electrode 111 are preferably made of Au/Ni and Ti/Al, respectively, which are material having a high reflectance for reflecting blue light and yellow light. Because of this constitution, the blue light E1 emitted downward from the active layer 107 and the yellow light E2 emitted downward from the ion implantation region 809 can be reflected on the p-side electrode 110 and the n-side electrode 111 to be emitted from the light emitting surface on the top side in the figure.

The semiconductor light emitting device of FIG. 17 can decrease the variation in tone in each device. This is because the ion concentration and implantation region in the ion implantation region 809 hardly vary in each device. That is, since the ion implantation can be carried out with high repeatability by a standardized process generally used in the manufacturing of semiconductor device, the ion concentration and implantation region in the ion implantation region 809 is uniform in each device. Thus, the ratio of the quantity of the blue light E1 emitted from the active layer 107 to the quantity of the yellow light E2 emitted from the ion implantation region 809 does not vary every element. Therefore, the tone does not vary device by device.

In the device of FIG. 17, even if the luminous efficiency of the active layer 809 varies for some reason or other, the ratio of the quantity of the blue light E1 to the quantity of the yellow light E2 is the same, so that the tone does not vary. For example, even if the luminous efficiency of the active layer 107 decreases for some reason or other, both of the blue light E1 and the yellow light E2 are weaken at the same rate, and the ratio of the quantity of the blue light E1 to the quantity of the yellow light E2 is the same, so that the tone does not vary. Thus, the variation in tone in each device is very small in the device of FIG. 17.

In the semiconductor light emitting device of FIG. 17, it is possible to easily adjust the tone by changing the area of the ion implantation region 809. By doing so, it is possible to easily vary the tone of white light if necessary. For example, when a device for emitting white light having a tone close to blue is intended to be manufactured as a displaying device, the area of the ion implantation region 809 may be decreased.

Moreover, in the semiconductor light emitting device of FIG. 17, the emission luminance can be made higher than that in conventional elements. That is, light emitted directly from the semiconductor light emitting element 1 can be utilized to increase the emission luminance.

Thirteenth Preferred Embodiment

Figure 18:
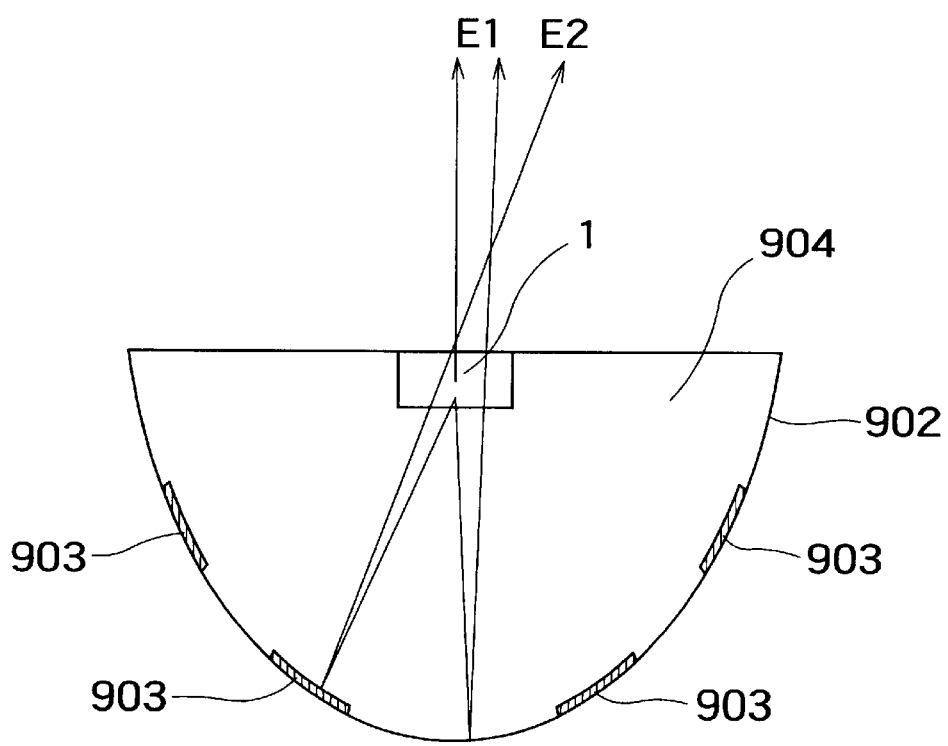
FIG. 18 is a schematic sectional view of the thirteenth preferred embodiment of a semiconductor light emitting device according to the present invention.

As shown in FIG. 18, the thirteenth preferred embodiment is characterized in that fluorescent material 903 for emitting yellow light E2 are formed in part of a reflector 902.

FIG. 18 is a schematic sectional view showing the thirteenth preferred embodiment of a semiconductor white light emitting device according to the present invention. The semiconductor light emitting device comprises a semiconductor light emitting element 1 for emitting blue light E1, a reflector 902 for reflecting the blue light E1 emitted from the semiconductor light emitting element 1, and a fluorescent material 903 applied on several parts of the reflecting surface of the reflector 902 for converting the wavelength of the blue light E1 to emit yellow light E2. The semiconductor light emitting element 1 and the reflector 902 are integrally formed of a mold resin 904. The semiconductor light emitting element in the ninth preferred embodiment (FIG. 13) may be used as the semiconductor light emitting element 1 in this embodiment. The fluorescent material 903 may be formed of, e.g., YAG:Ce. The fluorescent material 903 is thinly applied on the several part of the reflecting surface of the reflector 902 so as to have a small thickness.

The device of FIG. 18 realizes white light by the blue light E1 reflected on the reflector 902 and the yellow light E2 emitted on the fluorescent material 903.

The semiconductor light emitting device of FIG. 18 can decrease the variation in tone in each device. The reason for this is as follows.

First, the area of fluorescent material regions, on which the fluorescent material 903 is applied, hardly varies in each device. That is, since the surface of the reflector 902 is even, it is possible to easily adjust the area thereof, so that the area of the fluorescent material regions hardly varies in each device.

Secondly, when the volume of a fluorescent material region varies while maintaining the area thereof on which the fluorescent material is applied, the variation in tone in each device is small. That is, in the applied fluorescent material 903 in the fluorescent material region, a portion near the semiconductor light emitting element 900, i.e., a portion near the surface of the fluorescent material region, has a high conversion efficiency for converting the blue light E1 into the yellow light E2, and even if the thickness of the fluorescent material region varies, the quantity of the fluorescent material 903 arranged near the surface of the fluorescent material region and having a high conversion efficiency does not vary, and it is only the quantity of the fluorescent material 903 having a low conversion efficiency that varies. Thus, even if the thickness of the fluorescent material region varies, the quantity of the fluorescent material 903 having a high conversion efficiency and having a great influence on the intensity of the yellow light E2 hardly varies. Therefore, even if the thickness of the fluorescent material region varies, this variation has a little influence on the intensity of the yellow light E2, so that the variation in tone in each device is small.

Thus, the semiconductor light emitting device of FIG. 18 can decrease the variation in tone in each device.

The semiconductor light emitting device of FIG. 18 can easily adjust the tone by changing the area of the fluorescent material regions on which the fluorescent materials 903 is applied. Thus, for example, even if the conversion efficiency of the fluorescent material 903 varies, it is possible to adjust the tone easily. For example, when the conversion efficiency of the fluorescent material 903 decreases, the tone may be adjusted by increasing the area of the fluorescent material regions.

In addition, the semiconductor light emitting device of FIG. 18 can adjust the tone by changing the area of the fluorescent material region on which the fluorescent material 903 is applied. Thus, it is possible to easily change the tone of white light if necessary. For example, when a device for emitting white light having a tone close to blue is intended to be manufactured, the area of the fluorescent material regions may be decreased.

Since the fluorescent material is applied on the reflector in the semiconductor light emitting device of FIG. 18, it is possible to easily adjust the angle of visibility.

Moreover, the semiconductor light emitting device of FIG. 18 can further improve the emission luminance than conventional devices. That is, in the device of FIG. 18, it is possible to utilize light emitted directly from the semiconductor light emitting device, and it is possible to increase the conversion efficiency of the fluorescent material 903 by widely and thinly applying the fluorescent material, thereby improving the emission luminance.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor light emitting device comprising:
    a semiconductor light emitting element which has an active layer for emitting primary light having a first wavelength by current injection; and
    at least one semiconductor laminate which is bonded to said semiconductor light emitting element and which has a first light emitting layer, excited by said primary light, for emitting secondary light having a second wavelength different from said first wavelength,
    wherein said primary light and said secondary light are mixed to be outputted, said semiconductor laminate has a second light emitting layer, excited by said primary light and said secondary light, for emitting tertiary light having a third wavelength.

2. A semiconductor light emitting device as set forth in claim 1, wherein said active layer is an $In_pGa_qAl_{1-p-q}N$ ($0 \leq p \leq 1, 0 \leq q \leq 1, 0 \leq p+q \leq 1$) active layer for emitting blue light,
    said first light emitting layer is an $In_bGa_cAl_{1-b-c}P$ ($0 \leq b \leq 1, 0 \leq c \leq 1, 0 \leq b+c \leq 1$) light emitting layer, excited by said blue light emitted from said active layer, for emitting green light, and
    said second light emitting layer is an $In_xGa_yAl_{1-x-y}P$ ($0 \leq x \leq 1, 0 \leq y \leq 1, 0 \leq x+y \leq 1$) light emitting layer, excited by said blue light and said green light, for emitting red light.

3. A semiconductor light emitting device comprising:
    a semiconductor light emitting element including:
        a substrate having a first and second a surface being opposed to each other, and having a transparency to primary light having a first wavelength;
        a buffer layer formed on the second surface of said substrate;
        a first conductive type semiconductor layer fanned on said buffer layer;
        an active layer formed on said first conductive type semiconductor layer, and emitting the primary light by current injection; and a second conductive type semiconductor layer formed on said active layer; and at least one semiconductor laminate including a light emitting layer excited by the primary light to emit secondary light having a second wavelength, the second wavelength being longer than the first wavelength, said semiconductor laminate being formed or a part of the first surface of said substrate.

4. A semiconductor light emitting device as set forth in claim 3, wherein a contact area of said semiconductor laminate to said substrate is ⅓ or more and ⅔ or less of the area of the second surface of said substrate.

5. A semiconductor light emitting device as set forth in claim 3, wherein said semiconductor laminate is bonded to the part of the first surface of said substrate.

6. A semiconductor light emitting device as set forth in claim 3, wherein the primary light and the secondary light are emitted toward the side of said second conductive type semiconductor layer with reference to the active layer.

7. A semiconductor light emitting device as set forth in claim 6, wherein said semiconductor laminate further includes a reflecting film, which reflects the secondary light toward the side of said second conductive type semiconductor layer with reference to the active layer.

8. A semiconductor light emitting device as set forth in claim 3, wherein the primary light and the secondary light are emitted toward the side of the first surface of said substrate with reference to the active layer.

9. A semiconductor light emitting device as set forth in claim 8, wherein said semiconductor laminate further includes a low-pass filter, which is formed in contact with the first surface of said substrate.

10. A semiconductor light emitting device as set forth in claim 9, wherein the low-pass filter has a high reflectance with respect to the secondary light, and has a low reflectance with respect to the primary light.

11. A semiconductor light emitting device as set forth in claim 3, wherein said active layer is a $In_pGa_qAl_{1-p-q}N$ ($0 \leq p \leq 1$, $0 \leq q \leq 1$, $0 \leq p+q \leq 1$) active layer, and said light emitting layer is an $In_bGa_cAl_{1-b-c}P$ ($0 \leq b \leq 1$, $0 \leq e \leq 1$, $0 \leq b+c \leq 1$) light emitting layer.

12. A semiconductor light emitting device as set forth in claim 11, wherein said semiconductor laminate has a structure wherein said light emitting layer is located between $In_dGa_eAl_{1-d-e}P$ ($0 \leq d \leq 1$, $0 \leq e \leq 1$, $0 \leq e \leq 1$, $0 \leq d+e \leq 1$) cladding layer and an $In_fGa_hAl_{1-f-h}P$ ($0 \leq f \leq 1$, $0 \leq h \leq 1$, $0 \leq f+h \leq 1$) cladding layer, and said semiconductor laminate on the side of said $In_fGa_hAl_{1-f-h}P$ cladding layer is bonded to a portion of said semiconductor light emitting element.

13. A semiconductor light emitting device as set forth in claim 12, wherein a thickness of said light emitting layer of said semiconductor laminate is 1 nm or more and 10 nm or less, and a thickness of said $In_rGa_hAl_{1-r-h}P$ cladding layer is 300 nm or less.

14. A semiconductor light emitting device comprising:

a semiconductor light emitting element including:

a substrate having a first and a second surface being opposed to each other, and having a transparency to primary light having a first wavelength;

a buffer layer formed on the second surface of said substrate;

a first conductive type semiconductor layer formed on said buffer layer;

an active layer formed on said first conductive type semiconductor layer, and emitting the primary light by current injection: and a second conductive type semiconductor layer formed on said active layer; and at least one semiconductor laminate including a light emitting layer excited by the primary light to emit secondary light having a second wavelength, and said semiconductor laminate being formed on a part of said second conductive type semiconductor layer.

15. A semiconductor light emitting device as set forth in claim 14, wherein a contact area of said semiconductor laminate to said second conductive type semiconductor layer is ⅓ or more and ⅔ or less of surface area of said second conductive type semiconductor layer.

16. A semiconductor light emitting device as set forth in claim 14, wherein said semiconductor laminate is bonded to said part of said second conductive type semiconductor layer.

17. A semiconductor light emitting device as set forth in claim 14, wherein the primary light and the secondary light are emitted toward the side of the first surface of said substrate with reference to the active layer.

18. A semiconductor light emitting device as set forth in claim 17, wherein said semiconductor laminate further includes a reflecting film, which reflects the secondary light toward the first surface of said substrate with reference to the active layer.

19. A semiconductor light emitting device as set forth in claim 14, wherein the primary light and the secondary light are emitted toward the side or said second conductive type semiconductor layer with reference to the active layer.

20. A semiconductor light emitting device as set forth in claim 19, wherein said semiconductor laminate further includes a low-pass filter, which is formed in contact with the second conductive type semiconductor layer.

21. A semiconductor light emitting device as set forth in claim 20, wherein the low-pass filter has a high reflectance with respect to the secondary light, and has a low reflectance with respect to the primary light.

22. A semiconductor light emitting device as set forth in claim 14, wherein said active layer is $In_pGa_qAl_{1-p-q}N$ ($0 \leq p \leq 1$, $0 \leq q \leq 1$, $0 \leq p+q \leq 1$) active layer, and said light emitting layer is an $In_bGa_cAl_{1-b-c}P$ ($0 \leq b \leq 1$, 1, $0 \leq c \leq 1$, $0 \leq b+c \leq 1$) light emitting layer.

23. A semiconductor light emitting device as set forth in claim 22, wherein said semiconductor laminate has a structure wherein said light emitting layer is located between an $In_fGa_hAl_{1-f-h}P$ ($0 \leq f \leq 1$, $0 \leq h \leq 1$, $0 \leq f+h \leq 1$) cladding layer and an $In_fGa_hAl_{1-f-h}P$ ($0 \leq f \leq 1$, $0 \leq h \leq 1$, $0 \leq f+h \leq 1$) cladding layer, and said semiconductor laminate on the side of said $In_fGa_hAl_{1-r-h}P$ cladding layer is bonded to said part of said second conductive type semiconductor layer.

24. A semiconductor light emitting device as set forth in claim 23, wherein a thickness of said light emitting layer of said semiconductor laminate is 1 nm or more and 10 nm or less, and a thickness of said $In_fGa_hAl_{1-r-h}P$ cladding layer is 300 nm or less.

* * * * *